US011979965B2

(12) United States Patent
Li et al.

(10) Patent No.: US 11,979,965 B2
(45) Date of Patent: May 7, 2024

(54) SUSCEPTORS FOR INDUCTION HEATING WITH THERMAL UNIFORMITY

(71) Applicants: King Abdullah University of Science and Technology, Thuwal (SA); KING FAHD UNIVERSITY OF PETROLEUM AND MINERALS, Dhahran (SA)

(72) Inventors: Xiaohang Li, Thuwal (SA); Kuang-Hui Li, Thuwal (SA); Hamad Saud Alotaibi, Dhahran (SA)

(73) Assignees: King Abdullah University of Science and Technology, Thuwal (SA); King Fahd University of Petroleum and Minerals, Dhahran (SA)

( * ) Notice: Subject to any disclaimer, the term of this patent is extended or adjusted under 35 U.S.C. 154(b) by 1001 days.

(21) Appl. No.: 16/507,399

(22) Filed: Jul. 10, 2019

(65) Prior Publication Data

US 2019/0335548 A1   Oct. 31, 2019

Related U.S. Application Data

(63) Continuation-in-part of application No. PCT/IB2018/050157, filed on Jan. 10, 2018.
(Continued)

(51) Int. Cl.
*H05B 6/10* (2006.01)
*C21D 9/60* (2006.01)
(Continued)

(52) U.S. Cl.
CPC ............... *H05B 6/105* (2013.01); *C21D 9/60* (2013.01); *C23C 16/4583* (2013.01);
(Continued)

(58) Field of Classification Search
CPC .......... H05B 6/105; C21D 9/60; C23C 16/46; C30B 25/12
(Continued)

(56) References Cited

U.S. PATENT DOCUMENTS 4,242,553 A * 12/1980 Frosch ................... H05B 6/105
                                                         117/211
4,778,971 A    10/1988 Sakimoto
(Continued)

FOREIGN PATENT DOCUMENTS

CN    103436862 B    4/2015
DE    19622402 C1    10/1997
(Continued)

OTHER PUBLICATIONS

Machine Translation of JP2006012951A (Year: 2023).*
(Continued)

*Primary Examiner* — Nathaniel E Wiehe
*Assistant Examiner* — Thomas J Ward
(74) *Attorney, Agent, or Firm* — Billion & Armitage

(57) ABSTRACT

Embodiments of the present disclosure describe a susceptor for chemical vapor deposition comprising a horizontal component with a top surface and a bottom surface, wherein the top surface is configured to support one or more wafers; a vertical component extending from the bottom surface of the horizontal component along a longitudinal axis that is substantially perpendicular to the horizontal component; and a hollow region within the vertical component. Embodiments of the present disclosure describe a susceptor for chemical vapor deposition comprising a horizontal plate with a top surface configured to support one or more wafers, a vertical rod integrated with and perpendicular to the horizontal plate,
(Continued)

and a hollow region within the vertical rod for promoting temperature uniformity across the top surface of the horizontal plate.

18 Claims, 34 Drawing Sheets

Related U.S. Application Data

(60) Provisional application No. 62/700,690, filed on Jul. 19, 2018, provisional application No. 62/444,877, filed on Jan. 11, 2017, provisional application No. 62/444,558, filed on Jan. 10, 2017.

(51) Int. Cl.
| | |
|---|---|
| C23C 16/458 | (2006.01) |
| C23C 16/46 | (2006.01) |
| C30B 25/12 | (2006.01) |
| H01L 21/67 | (2006.01) |
| H05B 6/36 | (2006.01) |

(52) U.S. Cl.
CPC .............. *C23C 16/46* (2013.01); *C30B 25/12* (2013.01); *H01L 21/67103* (2013.01); *H05B 6/36* (2013.01)

(58) Field of Classification Search
USPC ........................................................ 219/643
See application file for complete search history.

(56) References Cited

U.S. PATENT DOCUMENTS

| | | | |
|---|---|---|---|
| 5,242,501 | A | 9/1993 | McDiarmid |
| 5,630,958 | A | 5/1997 | Stewart et al. |
| 5,700,725 | A | 12/1997 | Hower et al. |
| 5,759,263 | A | 6/1998 | Nordell et al. |
| 5,835,678 | A | 11/1998 | Li et al. |
| 5,964,943 | A | 10/1999 | Stein et al. |
| 6,031,211 | A | 2/2000 | Mailho et al. |
| 6,091,063 | A | 7/2000 | Woods |
| 6,153,012 | A * | 11/2000 | Rupp ...................... C30B 25/12 |
| | | | 118/724 |
| 6,217,662 | B1 | 4/2001 | Kong et al. |
| 6,321,680 | B2 | 11/2001 | Cook et al. |
| 6,368,404 | B1 | 4/2002 | Gurary et al. |
| 6,423,949 | B1 * | 7/2002 | Chen ................. H01L 21/67103 |
| | | | 118/725 |
| 7,070,743 | B2 | 7/2006 | Blackwell et al. |
| 7,126,090 | B2 | 10/2006 | Yamaguchi et al. |
| 8,709,162 | B2 | 4/2014 | Leung et al. |
| 9,299,595 | B2 | 3/2016 | Dunn et al. |
| 2003/0049372 | A1 * | 3/2003 | Cook ................. C23C 16/45574 |
| | | | 118/724 |
| 2003/0209326 | A1 * | 11/2003 | Lee ......................... C23C 16/46 |
| | | | 156/345.52 |
| 2008/0036155 | A1 | 2/2008 | Shimazaki et al. |
| 2010/0199914 | A1 | 8/2010 | Iza |
| 2011/0303154 | A1 * | 12/2011 | Kim .................. C23C 16/45521 |
| | | | 118/728 |
| 2016/0021707 | A1 | 1/2016 | Ibrani |

FOREIGN PATENT DOCUMENTS

| | | | | |
|---|---|---|---|---|
| JP | 2006012951 | A * | 1/2006 | ........... H01L 21/205 |
| JP | 2013115264 | A | 6/2013 | |
| WO | 2010108744 | A1 | 9/2010 | |

OTHER PUBLICATIONS

EP Extended Search Report for EP Application No. 19187450.2 dated Oct. 28, 2019.

"Comsol Multiphysics User's Guide", Version 4.3, May 2012, 1292 pages.

Fujimoto , et al., "Growth of High-Quality AlN at High Growth Rate by High-Temperature MOVPE", Physica Status Solidi (C), vol. 3, No. 6, 2006, pp. 1617-1619.

Gourvest , et al., "Plasma Enhanced Chemical Vapor Deposition of Conformal GeTe Layer for Phase Change Memory Applications", ECS Journal of Solid State Science and Technology, vol. 1, No. 6, Oct. 1, 2012, pp. Q119-Q122.

Griffiths , "Introduction to Electrodynamics, 3rd Edition", Reed College, 1999, 596 pages.

Hu , et al., "Finite Element Analysis of Temperature Field of Electromagnetic Heating in Nitride MOCVD Reaction Chamber", Materials Science and Engineering, vol. 322, 022006, 2018, pp. 1-6.

Hu , et al., "Porous Yttria-Stabilized Zirconia Ceramics With Ultra-Low Thermal Conductivity", Journal of Materials Science, vol. 45, 2010, pp. 3242-3246.

Jackson , "Classical Electrodynamics", 3rd Edition, 1998, 833 pages.

Khan , et al., "Ultraviolet Light-Emitting Diodes Based on Group Three Nitrides", Nature Photonics, vol. 2, Feb. 2008, pp. 77-84.

Kim , et al., "Multiphysics Modeling and Design of Ultralarge Multiwafer MOVPE Reactor for Group III-Nitride Light Emitting Diodes", 11th International Conference Thermal, Mechanical & Multi-Physics Simulation, and Experiments in Micro-Electronics and Micro-Systems (EuroSimE), 2010, pp. 1-7.

Kirchhoff , "On the Relationship Between Emission and Absorption of Light and Heat", Monthly Reports of Academy of Sciences in Berlin, 1859, pp. 783-787.

Lenz , "On the Determination of the Direction of the Galvanic Currents Excited by Electrodynamic Distribution", Annals of Physics and Chemistry, vol. 107, 1834, pp. 483-494.

Li , et al., "A Susceptor Heating Structure in MOVPE Reactor by Induction Heating", Applied Thermal Engineering, vol. 67, 2014, pp. 423-428.

Li, et al., "A Susceptor with a A-shaped Slot in a Vertical MOCVD Reactor by Induction Heating", Journal of Semiconductors, vol. 35, No. 9, Sep. 2014, pp. 092003-1-092003-5.

Li , et al., "A Susceptor with Partial-Torus Groove in Vertical MOCVD Reactor by Induction Heating", International Journal of Heat and Mass Transfer, vol. 75, 2014, pp. 410-413.

Li , et al., "Induction-Heating MOCVD Reactor with Significantly Improved Heating Efficiency and Reduced Harmful Magnetic Coupling", Journal of Crystal Growth, vol. 488, 2018, pp. 16-22.

Li , et al., "Modeling and Simulation of a Novel Susceptor Composed of Two Materials in MOVPE Reactor", Journal of Crystal Growth, vol. 402, 2014, pp. 175-178.

Li , et al., "Thermal Transportation Simulation of a Susceptor Structure with Ring Groove for the Vertical MOCVD Reactor", Journal of Crystal Growth, vol. 311, 2009, pp. 4679-4684.

Li , et al., "Thermal-Stress Analysis on the Crack Formation of Tungsten During Fusion Relevant Transient Heat Loads", Nuclear Materials and Energy, vol. 13, 2017, pp. 68-73.

Qu , et al., "Analysis and Design of Resistance-Wire Heater in MOCVD Reactor", Journal of Central South University, vol. 21, 2014, pp. 3518-3524.

Rice , et al., "Effects of Deposition Temperature and Ammonia Flow on Metal-Organic Chemical Vapor Deposition of Hexagonal Boron Nitride", Journal of Crystal Growth, vol. 485, 2018, pp. 90-95.

Rudnev , et al., "Handbook of Induction Heating", CRC Press, 2003, 796 pages.

Slack , "Anisotropic Thermal Conductivity of Pyrolytic Graphite", Physical Review, vol. 127, No. 3, 1962, pp. 694-701.

Tsai , et al., "Numerical Simulation of the Temperature Distribution in a Planetary MOCVD Reactor", Chemical Engineering and Processing, vol. 81, 2014, pp. 48-58.

Wallace , "The Band Theory of Graphite", Physical Review, vol. 71, No. 9, May 1, 1947, pp. 622-634.

Wang , et al., "Anisotropic Thermal Conductivity and Permeability of Compacted Expanded Natural Graphite", Applied Thermal Engineering, vol. 30, 2010, pp. 1805-1811.

(56) References Cited

OTHER PUBLICATIONS

Watanabe, et al., "Far-Ultraviolet Plane-Emission Handheld Device Based on Hexagonal Boron Nitride", Nature Photonics, vol. 3, Oct. 2009, pp. 591-594.
Zhang, et al., "High-Quality AlGaN Layers over Pulsed Atomic-Layer Epitaxially Grown AlN Templates for Deep Ultraviolet Light-Emitting Diodes", Journal of Electronic Materials, vol. 32, No. 5, 2003, pp. 364-370.
Notification of Transmittal of the International Search Report and the Written opinion of the International searching Authority, or the Declaration for PCT/IB2018/050157 dated Apr. 19, 2018.
Li, Kuang-Hui, et al., "Improvement of temperature uniformity of induction-heated T-shape susceptor for high-temperature MOVPE", Journal of Crystal Growth 488 (2018), 18 pages.
Extended European Search Report for EP Application No. 23184258.4, dated Oct. 17, 2023, 8 pages.

\* cited by examiner

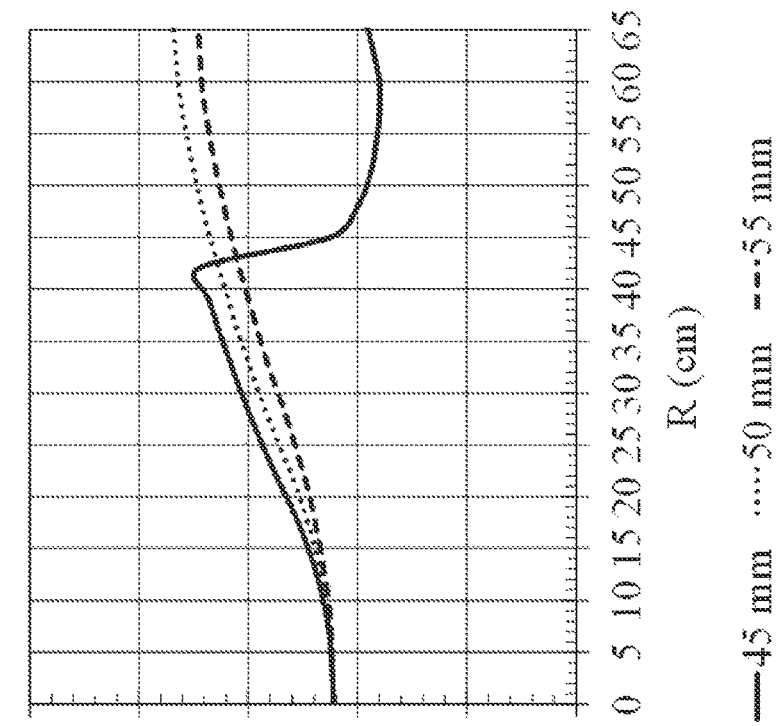
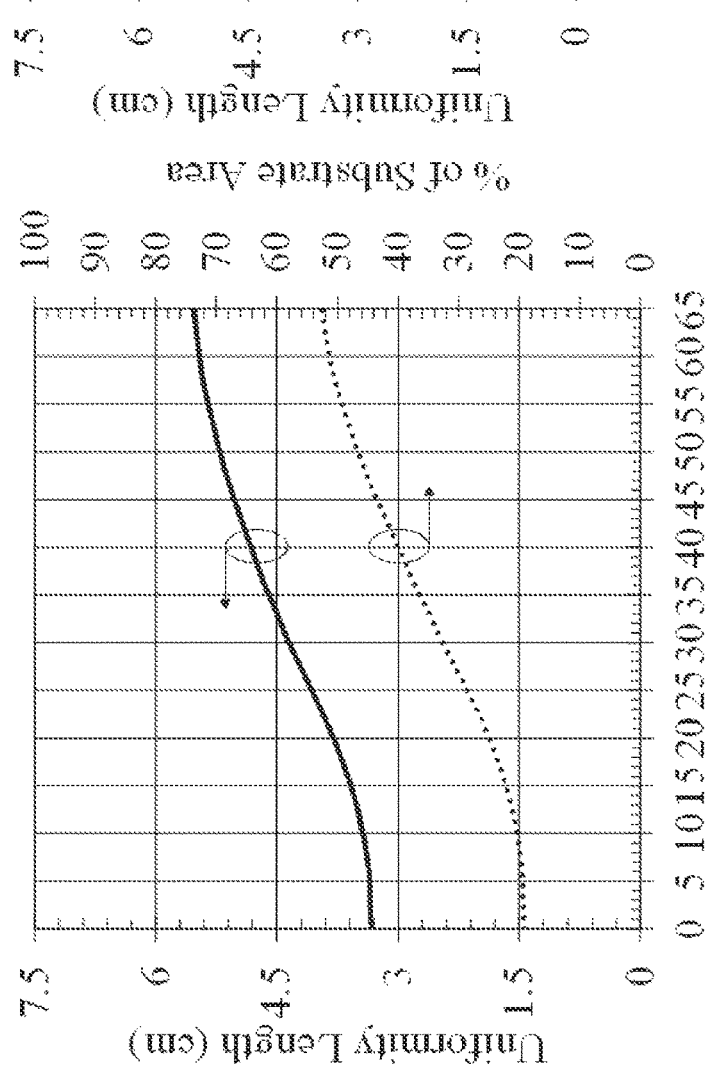
FIG. 30A
FIG. 30B

SUSCEPTORS FOR INDUCTION HEATING WITH THERMAL UNIFORMITY

BACKGROUND

A conventional cylinder-shaped solid susceptor with a hole in the bottom thereof is commonly used in chemical vapor deposition systems with induction heating. However, the conventional hole design does not take into account properties of induction heating and heat transfer. As a result, the susceptor surface temperature is not uniform. For instance, at the center of the susceptor surface, the temperature can be considerably higher (or lower) than the temperature at the edge. This non-uniform temperature distribution across the surface of the susceptor surface is undesirable for the uniformity of physical and chemical properties of the deposited materials. Such non-uniform temperature distributions are also undesirable where control over growth temperature is critical for material fabrication and growth.

SUMMARY

In general, embodiments of the present disclosure describe susceptors for induction heating with thermal uniformity.

Accordingly, embodiments of the present disclosure describe a susceptor for chemical vapor deposition comprising a horizontal component with a top surface and a bottom surface, wherein the top surface is configured to support one or more wafers; a vertical component extending from the bottom surface of the horizontal component along a longitudinal axis that is substantially perpendicular to the horizontal component; and a hollow region within the vertical component.

Embodiments of the present disclosure further describe a susceptor for chemical vapor deposition comprising a horizontal plate with a top surface configured to support one or more wafers, a vertical rod integrated with and perpendicular to the horizontal plate, and a hollow region within the vertical rod for promoting temperature uniformity across the top surface of the horizontal plate.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIGS. 30A-30B show, for a susceptor for a 6 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure.

DETAILED DESCRIPTION

The invention of the present disclosure relates to susceptors for chemical vapor deposition (CVD) and/or metal-organic chemical vapor deposition (MOCVD). It is based on the devices, apparatuses, and methods described more fully in U.S. Patent Application No. 62/396,679, which is incorporated by reference in its entirety. The susceptors of the present disclosure provide a uniform and/or substantially uniform temperature distribution for the fabrication of high-quality thin films. In particular, the invention of the present disclosure relates to susceptors with hollow regions for providing a uniform and/or substantially uniform temperature distribution across a top surface of the susceptor. The susceptors of the present disclosure may, for example, include a horizontal component (e.g., horizontal plate) with a top surface and a bottom surface, wherein the top surface is configured to support one or more wafers; a vertical component (e.g., vertical rod) extending from the bottom surface of the horizontal component along a longitudinal axis that is substantially perpendicular to the horizontal component; and a hollow region within the vertical component. The hollow region may be within the vertical rod and characterized by a depth and/or radius that may be adjusted to meet the requirements of a particular application. Other dimensions and parameters of the susceptor also may be adjusted to meet application requirements.

Figure 1:
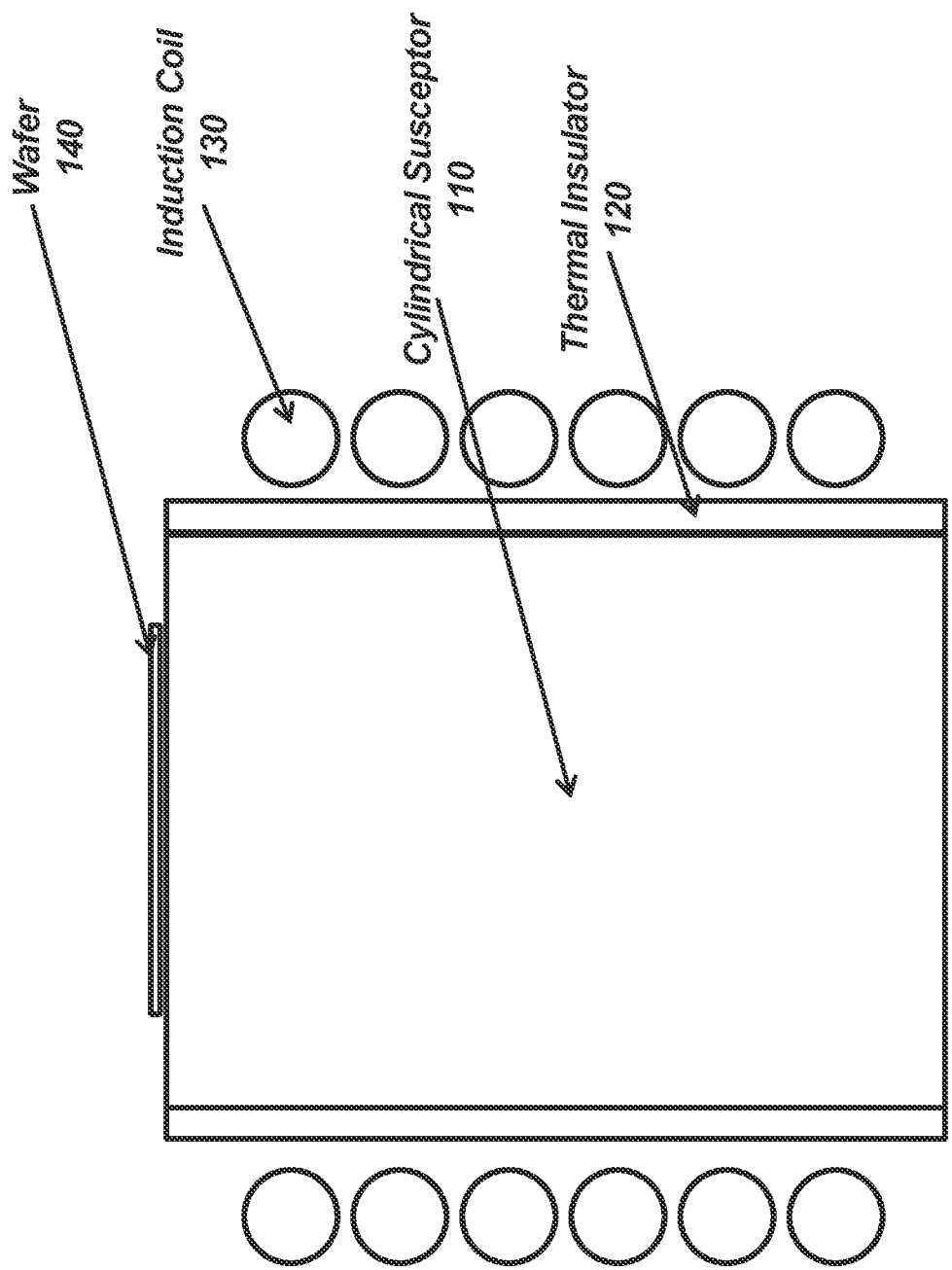
FIG. 1 is a schematic diagram of a design of a solid cylinder-shaped susceptor surrounded by a thermal insulator with induction coils, according to one or more embodiments of the present disclosure.
Figure 2:
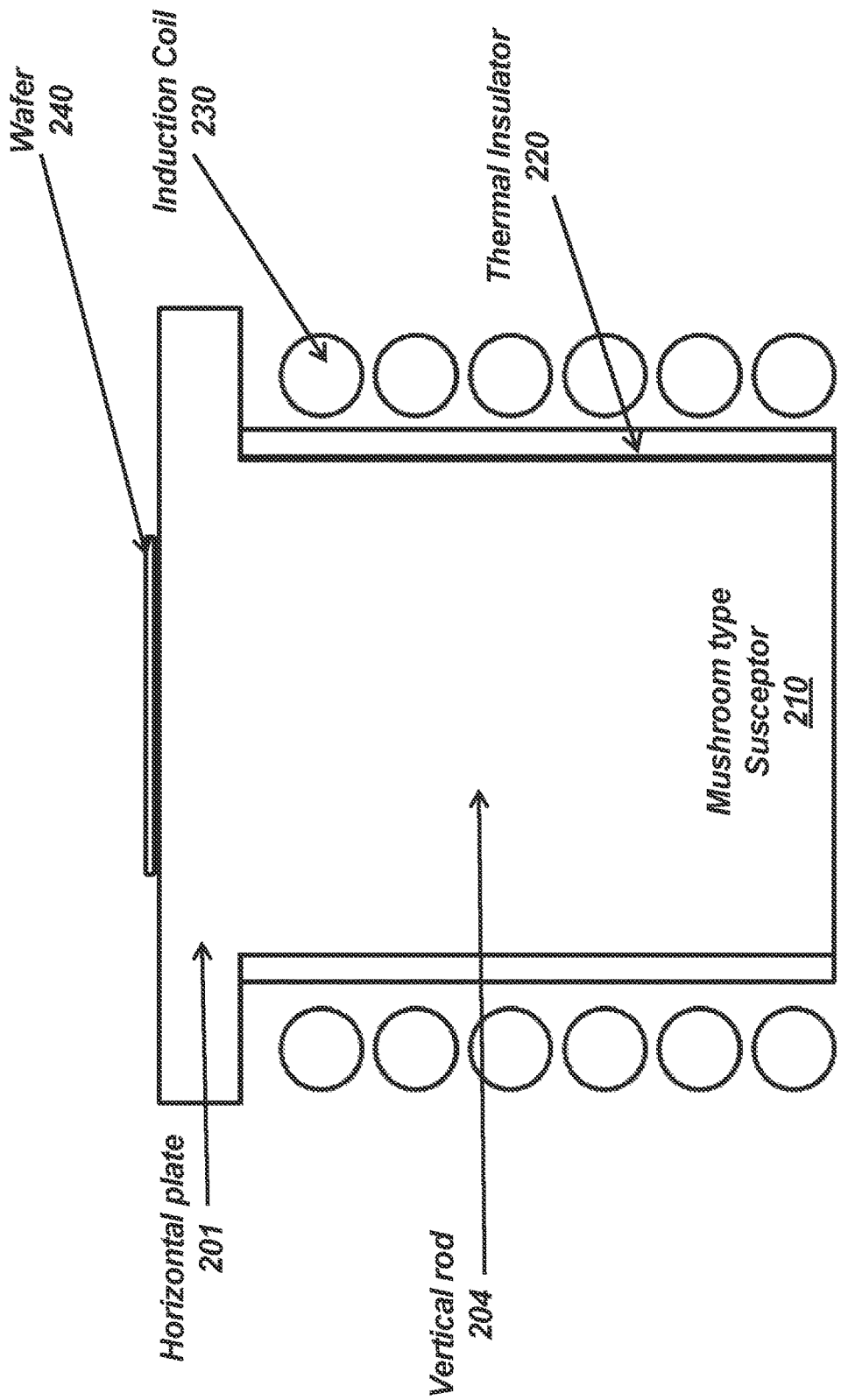
FIG. 2 is a schematic diagram of a design of a solid mushroom-shaped susceptor surrounded by a thermal insulator with induction coils, according to one or more embodiments of the present disclosure.

FIGS. 1 and 2 are schematic diagrams of a design of a solid susceptor surrounded by a thermal insulator with induction coils, according to one or more embodiments of the present disclosure. In particular, FIG. 1 is a schematic diagram of a design of a solid cylindrical-shaped susceptor 110 with thermal insulator 120. Induction coils 130 are provided to an exterior of the thermal insulator 120 and surround both the thermal insulator 120 and the cylindrical-shaped susceptor 110. A wafer 140 is provided on a surface of the cylindrical susceptor. FIG. 2 is a schematic diagram of a design of a solid mushroom-shaped susceptor 210. The mushroom-shaped susceptor includes a horizontal plate 201 positioned above a vertical rod 204. A thermal insulator 220 surrounds the vertical rod 204 and an induction coil 230 surrounds both the thermal insulator 220 and the vertical rod 204.

A difference between the susceptors of FIGS. 1 and 2 is that the susceptor of FIG. 1 is a solid cylinder-shaped susceptor and the susceptor of FIG. 2 is a solid mushroom-shaped susceptor. In many embodiments, heat induction is used for MOCVD. For example, a power supply is utilized to pass an alternating current through the induction coils. The induction coils generate an alternating magnetic flux that penetrates the solid susceptor and induces eddy currents that flow through the susceptor according to Faraday's law and generate heat. The skin effect, however, limits the depth to which the eddy currents flow through the susceptor generally to a region between the surface of the susceptor and a level below the surface referred to as the skin depth. Eddy current thus does not flow along the radial direction of the susceptor uniformly. Heat transfer from that region may cause the temperature to be greater at the center of the susceptor than at the edges thereof due to the skin effect and geometry-dependent heat transfer. This results in a non-uniform temperature distribution in a radial direction of the susceptor.

Figure 3:
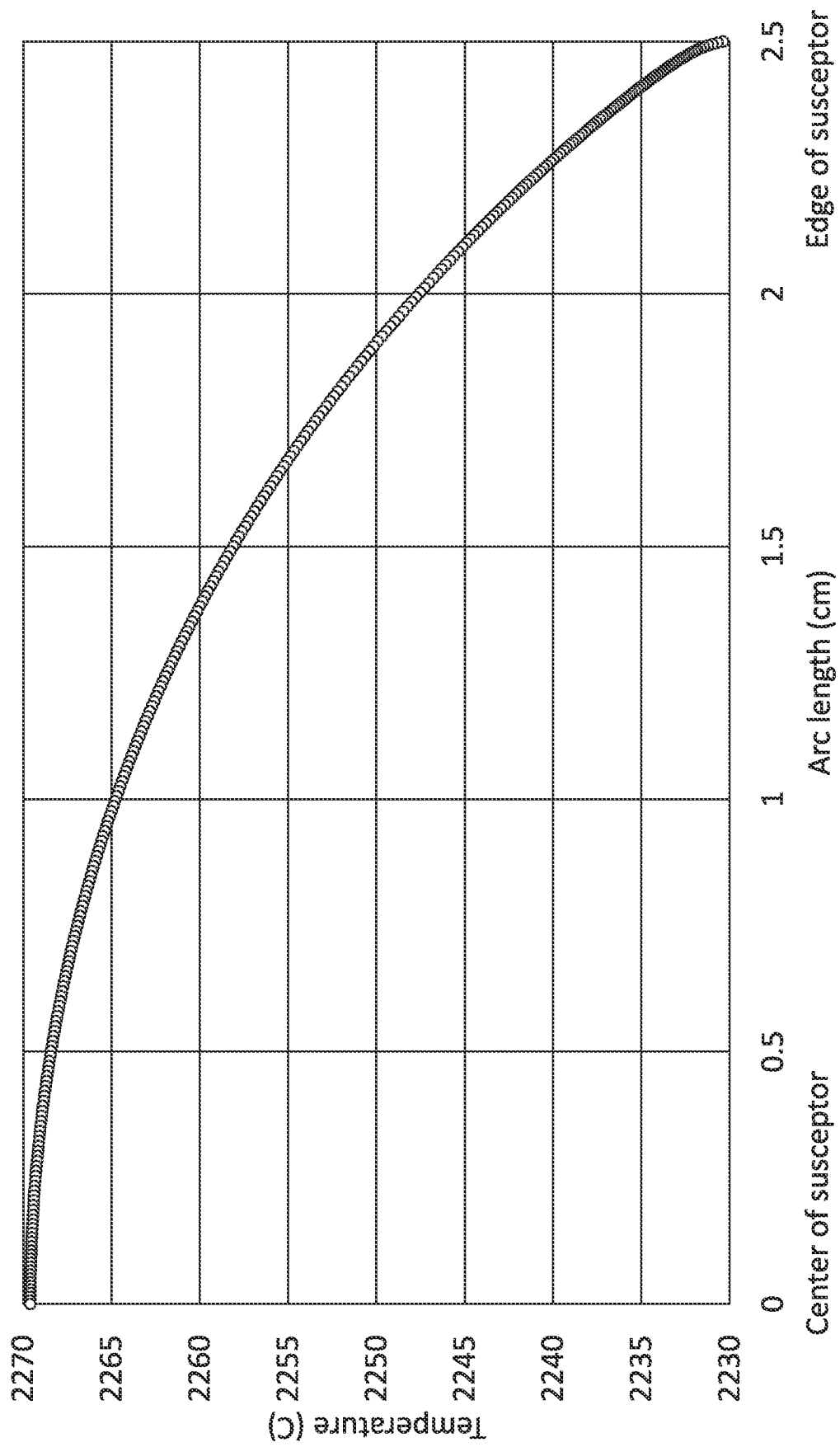
FIG. 3 is a graphical view of a temperature profile showing temperature non-uniformity of a 2" wafer on the solid cylinder-shaped susceptor of FIG. 1, according to one or more embodiments of the present disclosure.
Figure 4:
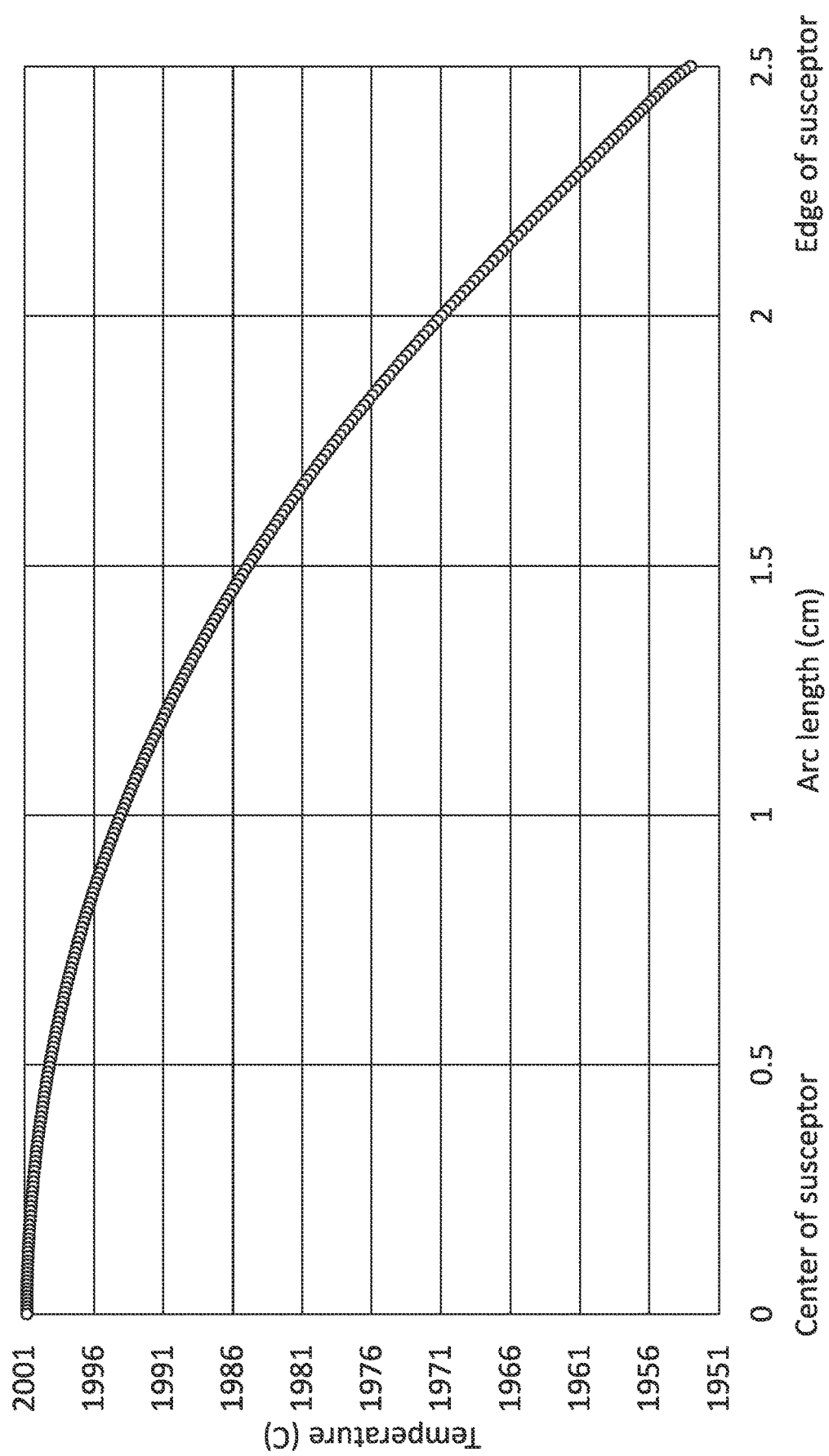
FIG. 4 is a graphical view of a temperature profile showing temperature non-uniformity of a 2" wafer on the solid mushroom-shaped susceptor of FIG. 2, according to one or more embodiments of the present disclosure.

FIGS. 3 and 4 are graphical views of temperature profiles showing temperature non-uniformity of a 2" wafer on a solid cylinder-shaped susceptor and solid mushroom-shaped susceptor, respectively, according to one or more embodiments of the present disclosure. As shown in FIG. 3, the temperature difference between a center of the susceptor and an edge of the susceptor is about 40° C. As shown in FIG. 4, the temperature difference between a center of the susceptor and an edge of the susceptor is about 50° C.

Figure 5:
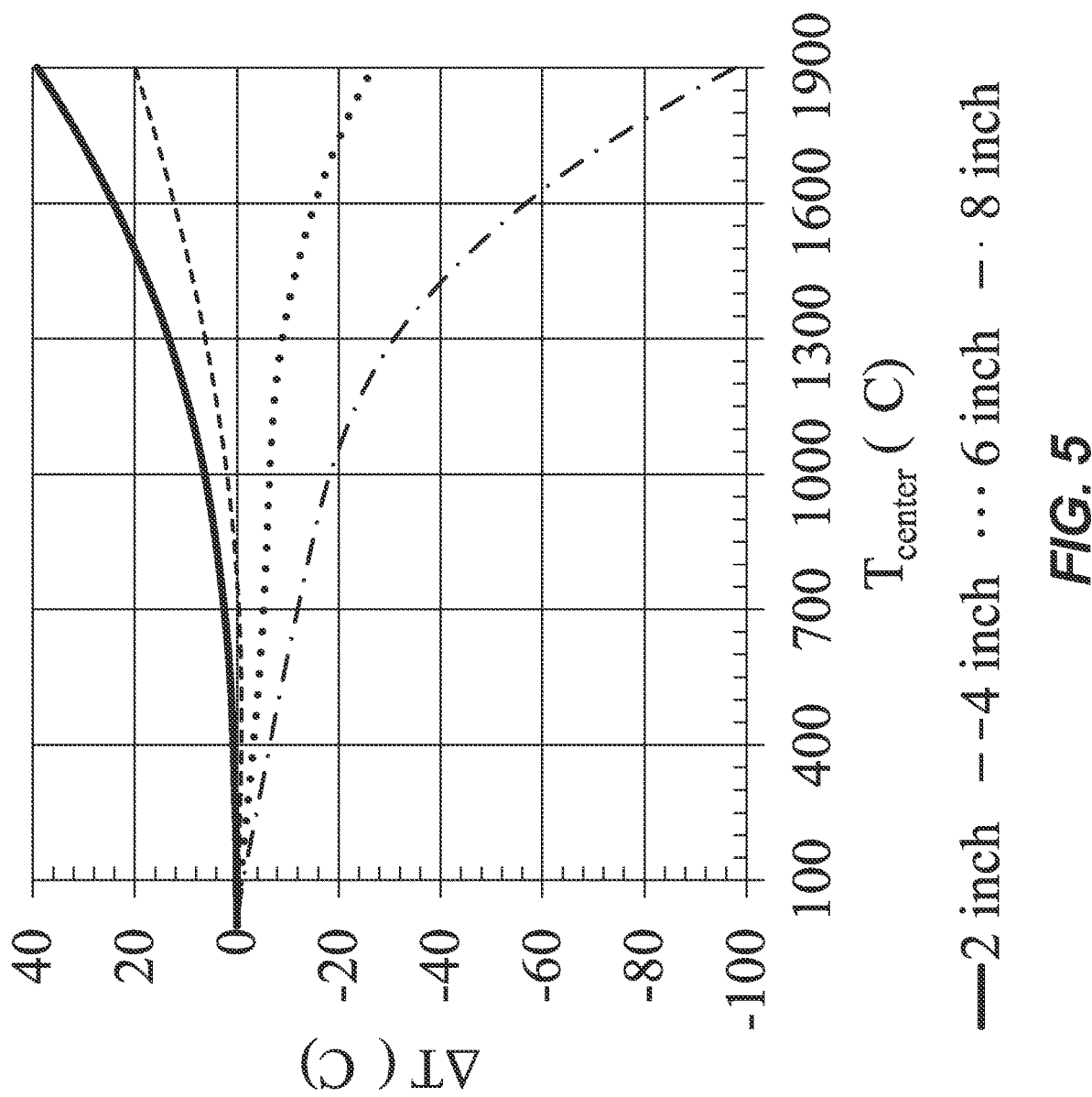
FIG. 5 is a graphical view of temperature profiles for 2, 4, 6, and 8 inch wafers, wherein the temperature profiles show temperature non-uniformity and a large increase in the temperature difference between the center and edge of the wafer as the temperature increases beyond 1000° C., according to one or more embodiments of the present disclosure.

In addition, a rise in temperature can also create larger temperature differences across a wafer. See, for example, FIG. 5, which is a graphical view of temperature profiles for 2, 4, 6, and 8 inch wafers, wherein the temperature profiles show temperature non-uniformity and a large increase in the temperature difference between the center and edge of the wafer as the temperature increases beyond 1000° C., according to one or more embodiments of the present disclosure. As shown in FIG. 5, temperature difference between the center and edge of wafer may be large when the temperature is above 1000° C. For example, 2, 4, 6, and 8 inch wafers show temperature non-uniformity and the temperature difference increases as the temperature is raised.

Further, while a temperature difference of about 3 percent between the center and edge of the susceptor may be acceptable for growth temperatures between about 1000° C. and about 1300° C., temperature uniformity may be critical for growth temperatures about 1700° C. and above, as crystal quality of the entire wafer in MOCVD may be highly affected (e.g., lead to the formation of cracks and/or defects) by temperature non-uniformity and/or large variations in temperature across the surface of the susceptor and wafer. A susceptor design that provides a uniform and/or substantially uniform temperature distribution across a surface of the susceptor is thus desirable for the fabrication of high-quality thin films via MOCVD.

Embodiments of the present disclosure describe a susceptor for chemical vapor deposition. The susceptor may include a horizontal component (e.g., horizontal plate) with a top surface and a bottom surface, wherein the top surface is configured to support one or more wafers. A vertical component may extend from the bottom surface of the horizontal component along a longitudinal axis that is substantially perpendicular to the horizontal component. For example, the vertical component (e.g., vertical rod) may be integrated with and perpendicular to the horizontal plate. A hollow region may be within the vertical component. In some embodiments, the susceptor or hollow region may further comprise fillets. In some embodiments, the susceptor or horizontal component may further comprise grooves or groove structures. In some embodiments, the susceptor further comprises one or more of a thermal insulator and induction coils (e.g., for generating heat). In some embodiments, the induction coil may be shifted downwards (e.g., by about 10 mm, or greater or less than 10 mm depending on the design) from the horizontal component. In some embodiments, the susceptor is a mushroom-shaped susceptor, a cylinder-shaped susceptor, or any other shaped susceptor suitable for the application.

The horizontal component (e.g., horizontal plate) may include a top surface and a bottom surface. The horizontal plate and the vertical rod may be made out of electronically or electrically conductive materials—and in many embodiments, not ionically conductive materials as known in the art, including graphite, or refractory metals (e.g., molybdenum). The electronic conductivity must be sufficient to allow eddy current to be induced in the susceptor and for the temperature to rise via induction heating.

The horizontal plate may be configured to support one or more wafers. In some embodiments, the horizontal plate is configured with one or more impressions or depressions such that the one or more wafers may be secured (e.g., prevented from moving) on the horizontal plate. The number of wafers supported and/or secured by the horizontal plate may include at least one, at least two, or at least five, or 2-100. A typical size of the wafer may be about 2, 4, 6, 8, or 12 inches in diameter. Wafers are known in the art and can come from different sizes, such as, for example, 2, 3, 4, 6, or 8 inch wafers.

In some embodiments, the horizontal plate may be a cylindrical, symmetrical disk shape in which the diameter is larger than the height and the vertical rod may be a cylindrical, symmetrical disk shape in which the diameter is less than the height.

The vertical component (e.g., vertical rod) may extend form the bottom surface of the horizontal component along a longitudinal axis that is substantially perpendicular to the horizontal component. The vertical rod may be integrated with and perpendicular to the horizontal plate. Integrating the vertical rod with the horizontal plate may increase power efficiency, as the rod is occupying most of the magnetic flux zone, which means maximum power may be utilized to heat the vertical rod. In many embodiments, the vertical rod functions as a heat source for the horizontal plate. The ratio of plate diameter and vertical rod height may be related to the design and can be adapted for a particular application. The length of the vertical rod may be as long as the induction coil. The vertical rod may be surrounded by more turns of coils as the length of the vertical rod increases. The strength of the magnetic flux increases as the number of turns of coil increase. The stronger magnetic flux may induce more eddy current on the vertical rod and generate more heat. In some embodiments, the diameter of the vertical rod is equal to or larger than the wafer diameter.

In an embodiment, the horizontal component or horizontal plate may comprise a cylindrical symmetrical disk shape and the vertical component may comprise a cylindrical symmetrical disk shape. In an embodiment, the radius of the horizontal component is greater than the radius of the vertical component (e.g., mushroom-shaped). In an embodiment, the radius of the horizontal component is about equal to the radius of the vertical component. In an embodiment, the radius of the horizontal component is about equal to or less than the radius of the vertical component. In an embodiment, the horizontal component and the vertical component are made of the same material. In an embodiment, the horizontal component and the vertical component are made of different material. In an embodiment, the horizontal component and the vertical component form a single continuous structure. In an embodiment, the horizontal component and the vertical component are combined to form a structure comprised of separate components.

The ratio of the diameter of the horizontal plate to the length of the vertical rod can be, for example, about 1:0.8. The ratio between the diameter of the horizontal plate to the diameter of the rod may be important. If the diameter of the plate is much larger than the diameter of the rod, the plate periphery may not sufficiently increase in temperature. The ratio can be, for example, about 1:0.6.

The hollow region promotes temperature uniformity across the top surface of the horizontal plate. The hollow region reduces heat transfer to the center of the top surface of the susceptor to provide a more uniform (e.g., uniform and/or substantially uniform) temperature distribution. For example, while the center of the top surface of a solid susceptor increased in temperature due to heat transfer from the edge of the susceptor and from the region below it, the center of the top surface of a hollow susceptor increases in temperature substantially only due to heat transfer from the edge. Heat transfer from the region below the top surface is minimal (e.g., negligible). In this way, among others, the invention of the present disclosure provides a uniform and/or substantially uniform temperature distribution across the top surface suitable for fabricating high-quality films. In many embodiments, the hollow region within the vertical component may include a cylindrical shape. However, this shall not be limiting as the hollow region may comprise any shape suitable for and/or that promotes temperature uniformity.

An insulating layer or insulating material may surround the vertical rods. In many embodiments, the insulating layer may be utilized to confine heat inside the vertical rod and to conduct the maximum heat toward the horizontal plate. The insulating layer may also be utilized to protect the coils from excessive heat.

The temperature distributions in embodiments with hollowed susceptors are more uniform than the temperature distributions in embodiments in which solid cylinder-shaped susceptors and/or solid mushroom-shaped susceptors are utilized. At least one reason for this is that the center of the solid susceptor increases in temperature due to heat transfer from below the top surface and from the edges of the susceptor; however, with respect to hollow susceptors, the center of the top surface of the susceptor increases in temperature only from heat transfer from the edges, which makes the temperature more uniform across the top surface.

In an embodiment, the top surface of the horizontal component has a substantially uniform temperature distribution in the radial direction. In an embodiment, the temperature difference across the top surface of the horizontal component in the radial direction is less than or equal to about 3 percent. In an embodiment, the temperature difference across the top surface of the horizontal component in the radial direction is less than about 20° C., less than about 15° C., less than about 10° C., less than about 5° C., or less than about 1° C. In a preferred embodiment, the temperature difference is less than about 5° C.

Figure 6:
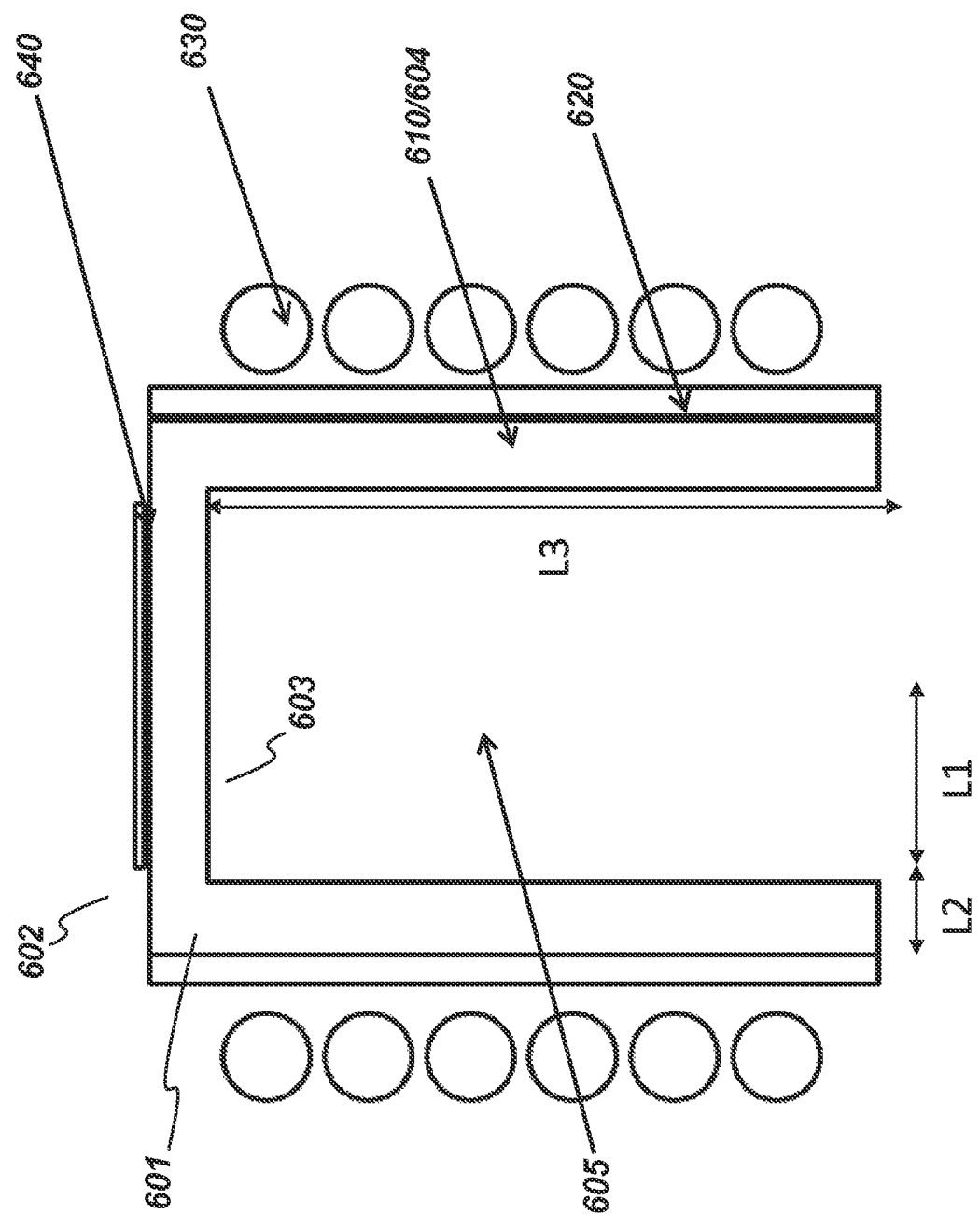
FIG. 6 is a schematic diagram of a hollowed cylinder-shaped susceptor with enhanced thermal uniformity on the top surface with the radius and depth of the cylindrical hollow region dependent upon the material, frequency, and temperature, according to one or more embodiments of the present disclosure.

In one embodiment, the susceptor may be a hollowed cylinder-shaped susceptor. For example, FIG. 6 is a schematic diagram of a hollowed cylinder-shaped susceptor with enhanced thermal uniformity on the top surface with the radius and depth of the cylindrical hollow region dependent upon the material, frequency, and temperature, according to one or more embodiments of the present disclosure. As shown in FIG. 6, the susceptor may include a cylinder-shaped susceptor (e.g., cylindrical susceptor) 610 including a cylindrical hole 605. The hollowed cylinder-shaped susceptor may include a horizontal component 601 (e.g., horizontal plate) with a top surface 602 and a bottom surface 603, wherein the top surface 602 is configured to support a wafer 640 and a vertical rod 604 extending from the bottom surface 603 of the horizontal plate 601 along a longitudinal axis that is substantially perpendicular to the horizontal plate 601. The vertical rod 604 or cylindrical susceptor 610 includes a hollow region (e.g., cylindrical hole 605). An induction coil 630 may surround the cylindrical susceptor 610. In addition, a thermal insulator layer 620 may optionally separate the susceptor from the induction coil. The horizontal plate and vertical rod may both be a cylindrical symmetrical disk shape with the same radius.

Figure 7:
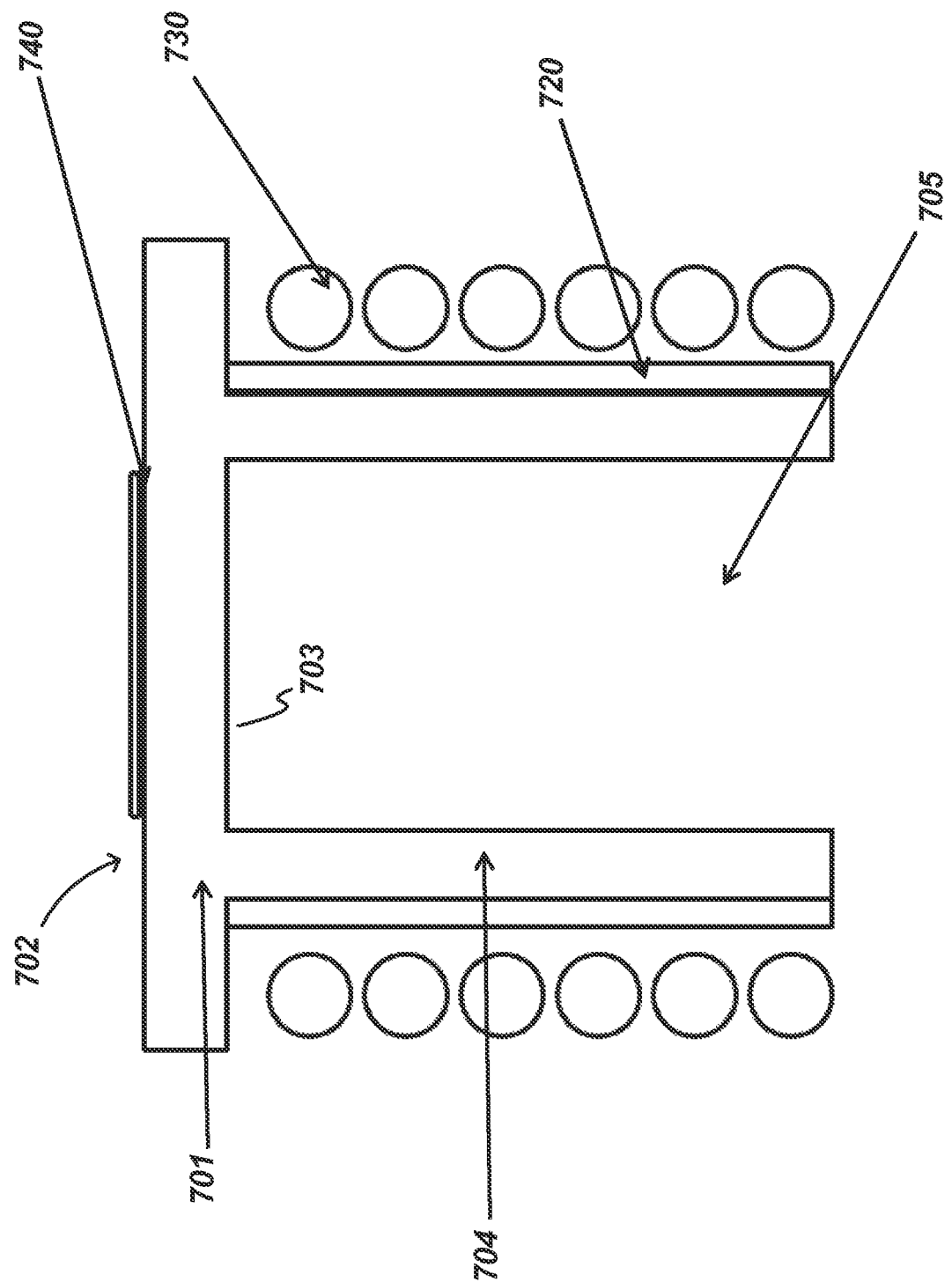
FIG. 7 is a schematic diagram of a hollowed mushroom-shaped susceptor with enhanced thermal uniformity on the top surface with the radius and depth of the cylindrical hollow region dependent upon the material frequency, and temperature, according to one or more embodiments of the present disclosure.

In another embodiment, the susceptor may be a hollowed mushroom-shaped susceptor. For example, FIG. 7 is a schematic diagram of a hollowed mushroom-shaped susceptor with enhanced thermal uniformity on the top surface with the radius and depth of the cylindrical hollow region dependent upon the material frequency, and temperature, according to one or more embodiments of the present disclosure. The mushroom-shaped susceptor shown in FIG. 7 may comprise a horizontal component 701 (e.g., horizontal plate)

with a top surface 702 and a bottom surface 703. The top surface 702 may be configured to support one or more wafers 740. A vertical component 704 (e.g., vertical rod or susceptor 710) may extend from the bottom surface 703 of the horizontal component 701 along a longitudinal axis that is substantially perpendicular to the horizontal component 701. The vertical component 704 may include a hollow region such as cylindrical hole 705. In general, the mushroom-shaped susceptor is similar to the cylindrical-shaped susceptor except the radius of the horizontal plate is greater than the radius of the vertical rod to produce the mushroom-shape. While the disclosure relates to cylindrical horizontal plates and vertical rods, the susceptors of the present disclosure may be fabricated in any shape.

The hollow regions of the hollowed cylinder-shaped susceptor and the mushroom-shaped susceptor may be characterized by four lengths: L1 refers to a radius of the cylindrical hollow region; L2 refers to a thickness of the vertical component (e.g., the difference between the radius of the cylinder-shaped susceptor and the radius of the cylindrical hollow region (L1)); L3 refers to the depth of the cylindrical hollow region; L4 refers to a thickness of the horizontal plate (e.g., the distance between the top surface and bottom surface) and L5 refers to the groove structure depth beneath the horizontal plate. As used herein, "L2" may refer to a thickness of a wall of the vertical rod. In many embodiments, the temperature distribution of the top surface of the susceptor may be improved by adjusting one or more of L1, L2, L3, L4, and L5. For example, the temperature distribution of the top surface of the susceptor may be made uniform and/or substantially uniform by adjusting one or more of L1 and L4. In another example, the temperature distribution may be substantially uniform and/or uniform for a 2-inch wafer on a Tungsten susceptor where L2 is about 5 mm and L3 is about 72 mm. For larger wafers, the temperature distribution on the top surface may be improved (e.g., more uniform, substantially uniform, and/or uniform) by increasing L2 and decreasing L3. Although the above discussion relates to L2 and L3 as design parameters, any of the three lengths (e.g., L1, L2, and/or L3) may be utilized in designing hollow susceptors.

Figure 8:
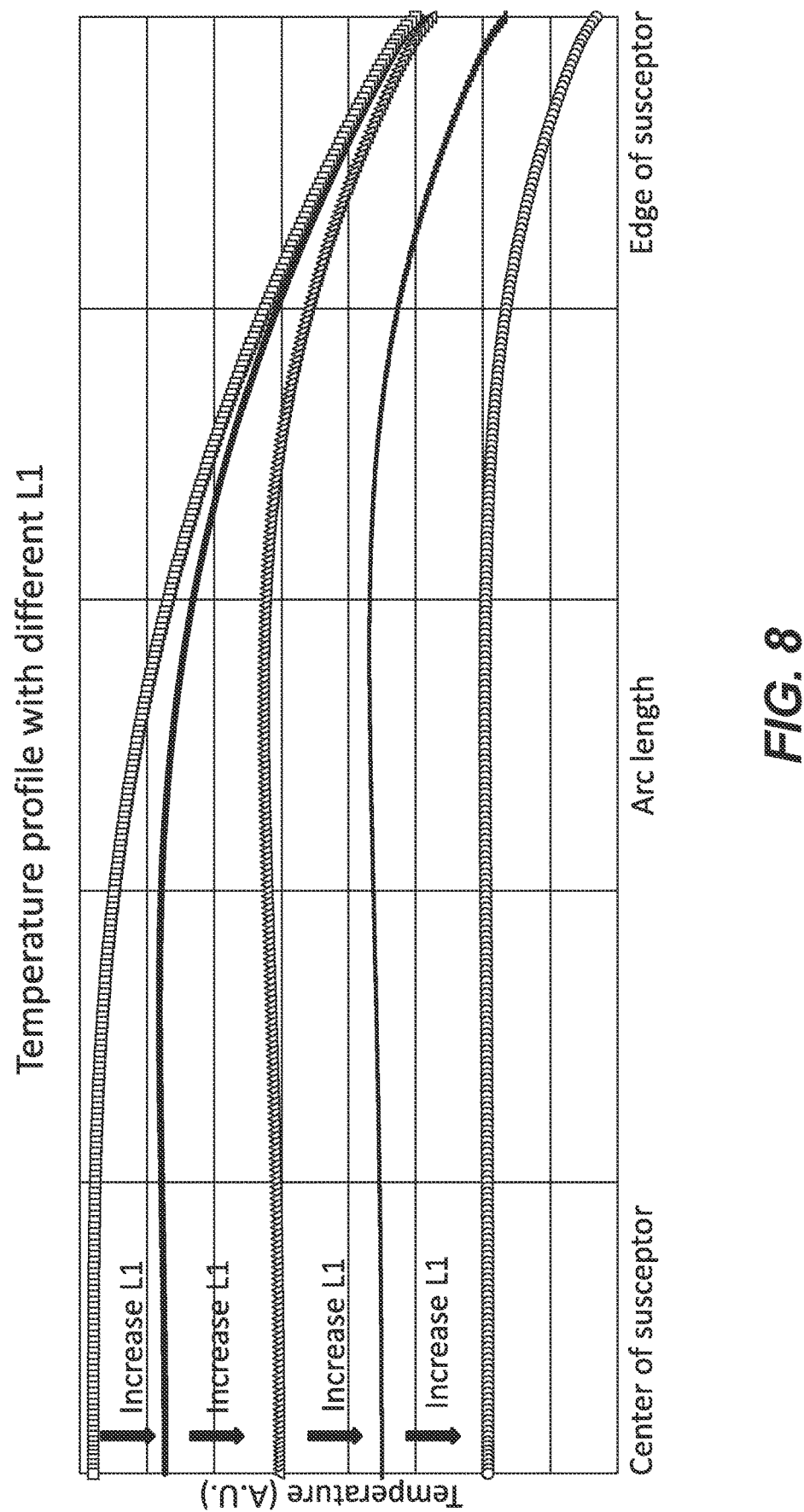
FIG. 8 is a graphical view of a temperature profile showing an improvement in temperature uniformity with an increase in L1, according to one or more embodiments of the present disclosure.
Figure 9:
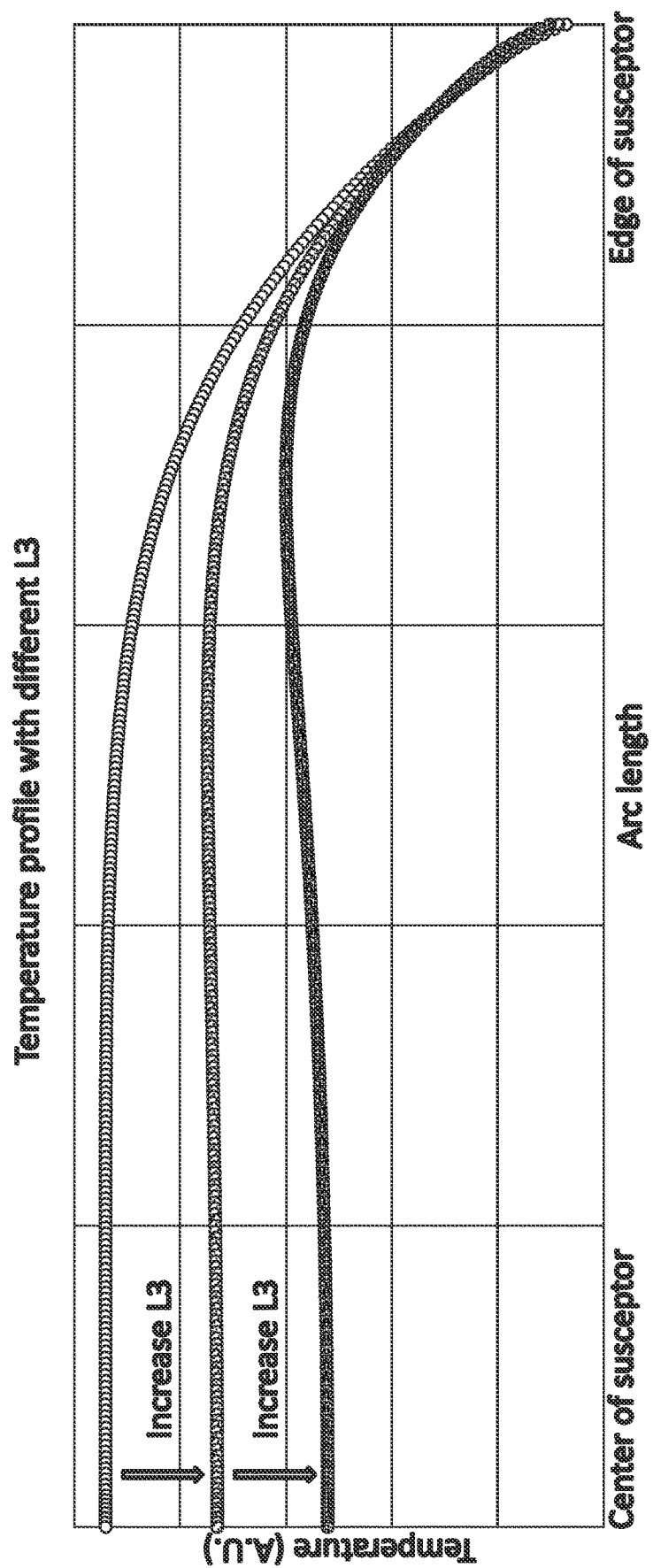
FIG. 9 is a graphical view of a temperature profile showing an improvement in temperature uniformity with an increase in L3, according to one or more embodiments of the present disclosure.

In many embodiments, L2 and L3 may be adjusted to about the skin depth to effectively manipulate heat transfer and improve temperature uniformity on the top surface of the horizontal plate. For example, a hollow susceptor with a large L2 and large L3 generally has a lower temperature at the center of the top surface than solid susceptors. For example, FIG. 8 is a graphical view of a temperature profile showing an improvement in temperature uniformity with an increase in L1, according to one or more embodiments of the present disclosure. Similarly, FIG. 9 is a graphical view of a temperature profile showing an improvement in temperature uniformity with an increase in L3, according to one or more embodiments of the present disclosure.

Skin depth may be approximated as follows. Based on the classical electromagnetic theory, the skin depth can be calculated by the following formula:

$$\delta = \sqrt{\frac{\rho_T}{\pi f \mu}} \sqrt{\sqrt{1 + (2\pi f \rho_T \epsilon)} + 2\pi f \rho_T \epsilon}$$

where $\rho_T$ is the resistivity of the conductor at temperature T, f is the frequency of the applied AC power, µ is the permeability of the conductor, and ϵ is the permittivity of the conductor. Because $2\pi f \rho_T \epsilon$ is a small quantity for common induction heaters, this formula may be further reduced to $$\delta = \sqrt{\frac{\rho_T}{\pi f \mu}} = 503.29 \sqrt{\frac{\rho_T}{f \mu_r}}$$

where $\mu_r$ is the relative permeability of the conductor. For most refractory conductors, $\rho_T$ is linearly proportional to the temperature, T, based on the formula $$\rho_T = \rho_0[1+\alpha(T-T_0)]$$

where $\rho_0$ is the reference resistivity of the conductor at temperature $T_0$, and α is the resistivity temperature coefficient of the conductor. For all existing conductors, the magnetic properties are paramagnetic at temperatures above 1400° C. and the relative permeability can be described by Curie's Law:

$$\mu_r = 1 + \frac{C}{T}$$

where C is the Curie Constant of the conductor. The skin depth may depend on frequency and temperature and may be described as $$\delta = 503.29 \sqrt{\frac{\rho_0[1+\alpha(T-T_0)]}{f\left(1+\frac{C}{T}\right)}}$$

This equation may be utilized in some embodiments to approximate the appropriate values for L2 and L3.

In some embodiments in which refractory conductors with high induction heating frequencies (e.g., about several thousand Hz) are utilized, skin depth is generally in the range of millimeters, which means that the inner region of the cylindrical-shaped solid susceptor is not affected by eddy current. In these embodiments, L2 should be greater than the skin depth because if L2 is less than or equal to the skin depth, the magnetic field may penetrate the hole and raise the surface temperature non-uniformly.

In an embodiment, a thickness of a wall of the vertical component is about greater than a skin depth. In an embodiment, a thickness of a wall of the vertical component is about equal to or less than a skin depth.

Figure 10C:
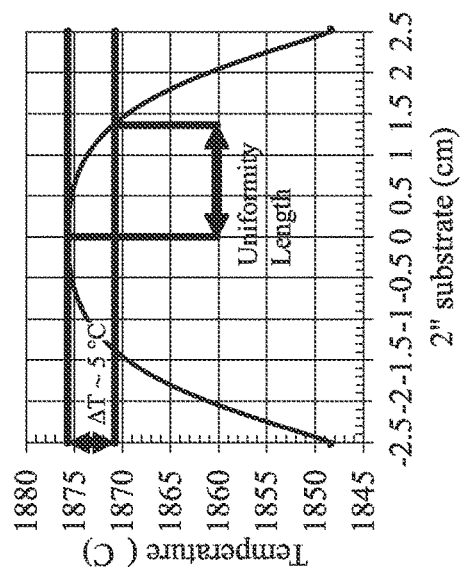
FIGS. 10A-10C are graphical views showing various definitions of uniformity length of a 2" substrate, according to one or more embodiments of the present disclosure.
Figure 10B:
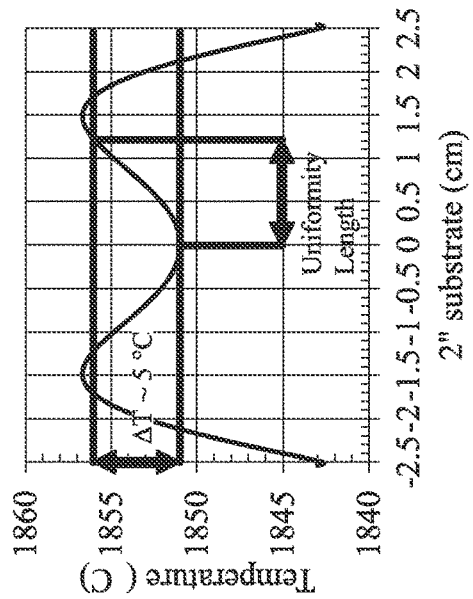
Figure 10A:
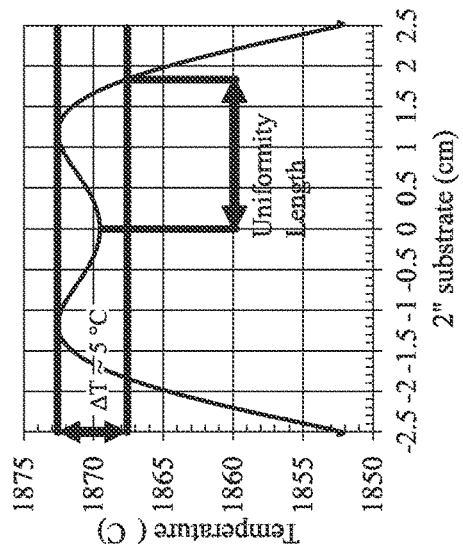

Temperature uniformity may be quantified by defining a uniformity length. In some embodiments, uniformity length may be defined as the length from the center of the horizontal component to a point at which a specified temperature difference has been observed. In an embodiment, the specified temperature difference may be observed at two points that do not include the temperature at the center point. For example, FIG. 10A is a graphical view showing the uniformity length of a 2" substrate, wherein the uniformity length is defined as the length from the center to another point at which there is a 5° C. temperature difference. In this figure, the 5° C. temperature difference is measured from a first non-center point to a second non-center point. FIG. 10B is a graphical view showing the uniformity length of a 2" substrate, wherein the uniformity length is similarly defined as the length from the center to another point at which there is a 5° C. temperature difference, except the 5° C. temperature difference is measured from the center point to a non-center point. In another embodiment, uniformity length is defined from the point with the highest temperature to the farthest point at which there is a 5° C. temperature difference. For example, FIG. 10C is a graphical view showing the uniformity length of a 2" substrate wherein the uniformity length is defined from the highest temperature to the farthest point which has a 5° C. temperature difference. In an embodiment, the uniformity length is less than about 10 inches, less than about 9 inches, less than about 8 inches, less than about 7 inches, less than about 6 inches, less than about 5 inches, less than about 4 inches, less than about 3 inches, less than about 2 inches, and/or less than about 1 inch.

Figure 11:
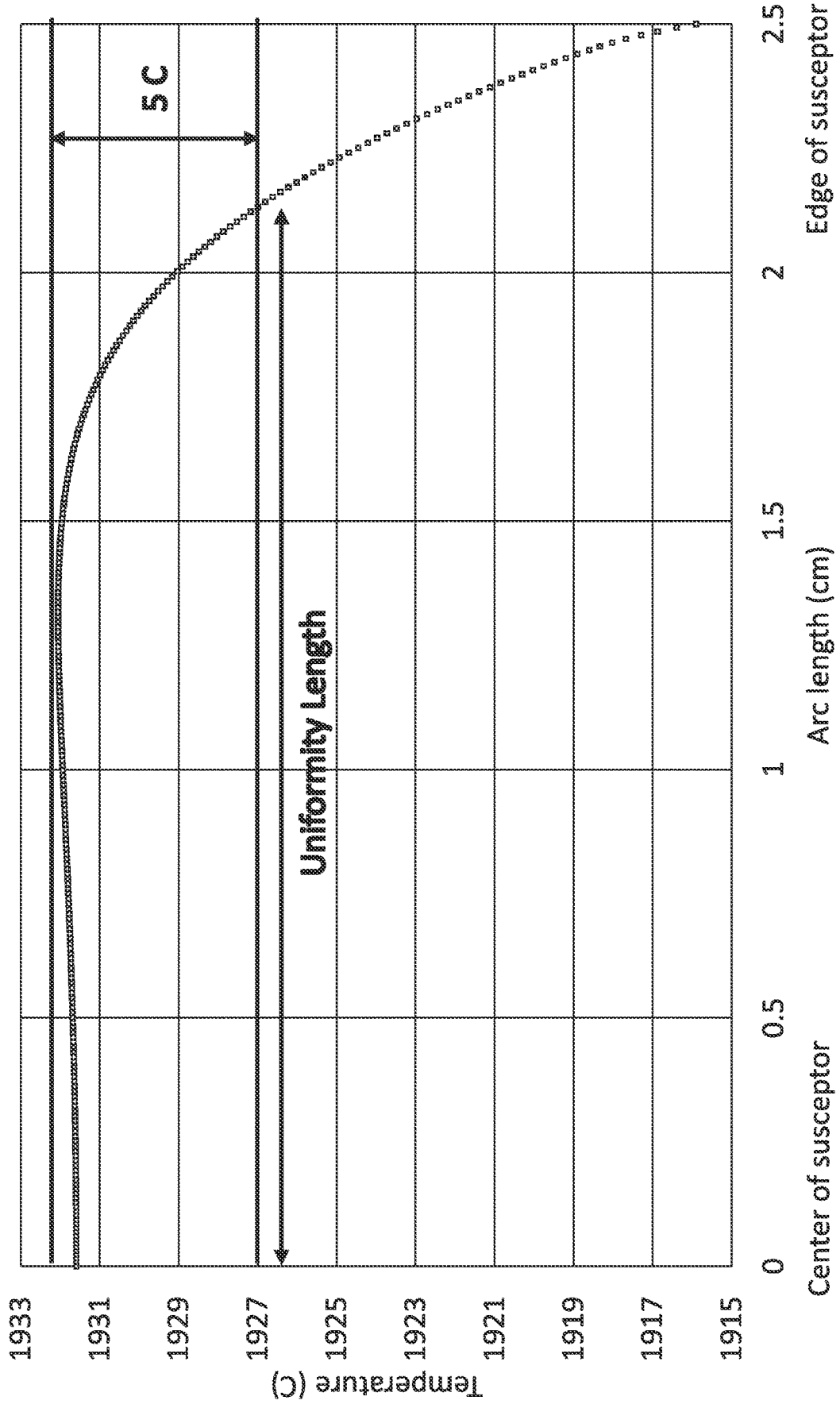
FIG. 11 is a graphical view showing how to define uniformity length on a 2" wafer, according to one or more embodiments of the present disclosure.
Figure 12:
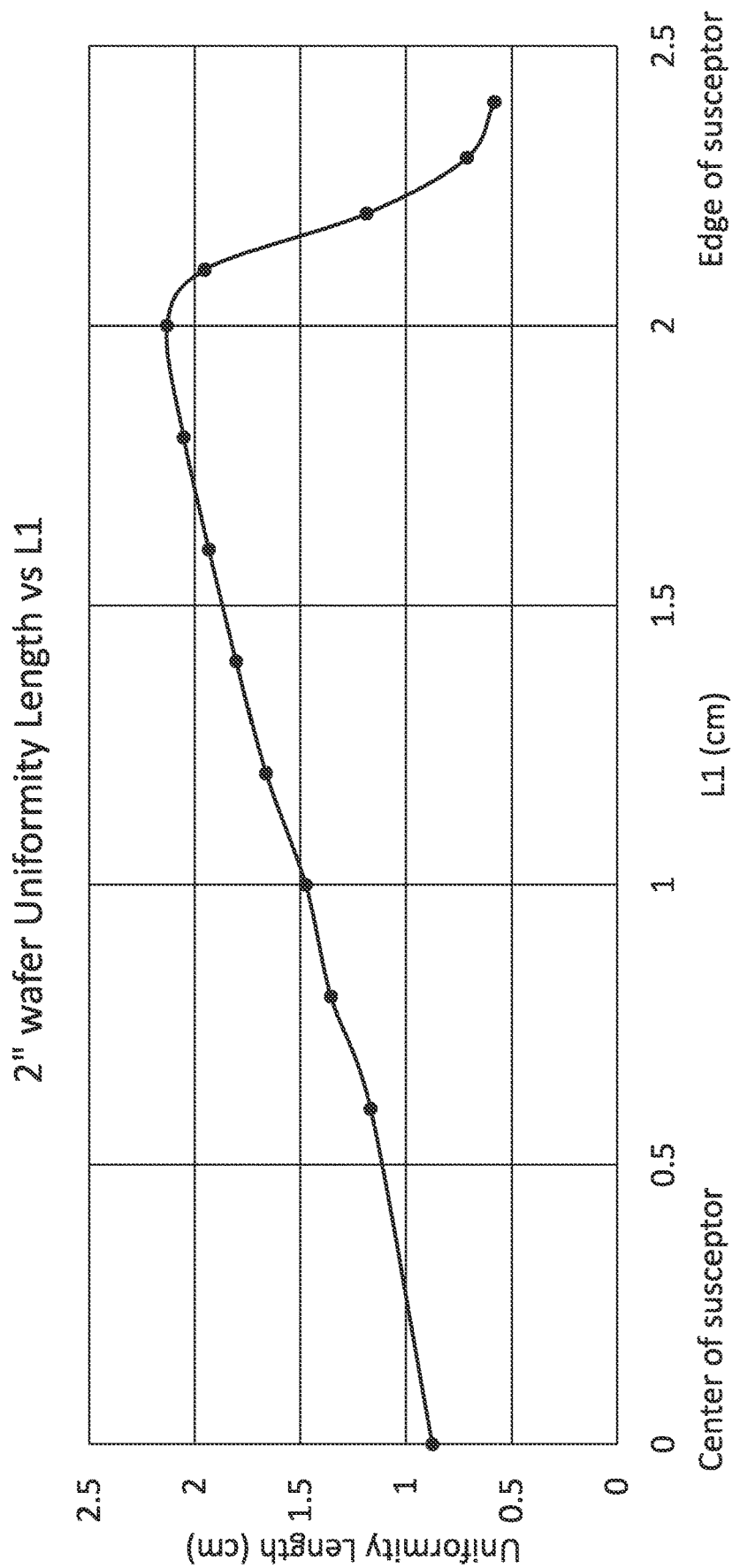
FIG. 12 is a graphical view showing how uniformity length of a 2" wafer varies with increasing L1, according to one or more embodiments of the present disclosure.

FIG. 11 is a graphical view showing how to define uniformity length on a 2" wafer, according to one or more embodiments of the present disclosure. The uniformity length, as illustrated in FIG. 11 for example, refers to a region within which the temperature difference on the top surface is less than a given temperature range (e.g., 5° C.) relative to the maximum temperature on the surface. For example, FIG. 12 is a graphical view showing how uniformity length of a 2" wafer varies with increasing L1, according to one or more embodiments of the present disclosure. The temperature uniformity length shown in FIG. 12 has a maximum length of about 2.13 cm (0.85 in) when L1 is about equal to 2 cm. This means that for a 2-inch wafer, 72.6% of the surface area has a temperature difference of less than about 5° C. relative to the maximum surface temperature. Conversely, only about 12.1% of the surface area has a temperature difference of less than about 5° C. relative to the maximum surface temperature in a solid susceptor with a uniformity length of about 0.87 cm (about 0.35 in.).

Figure 13:
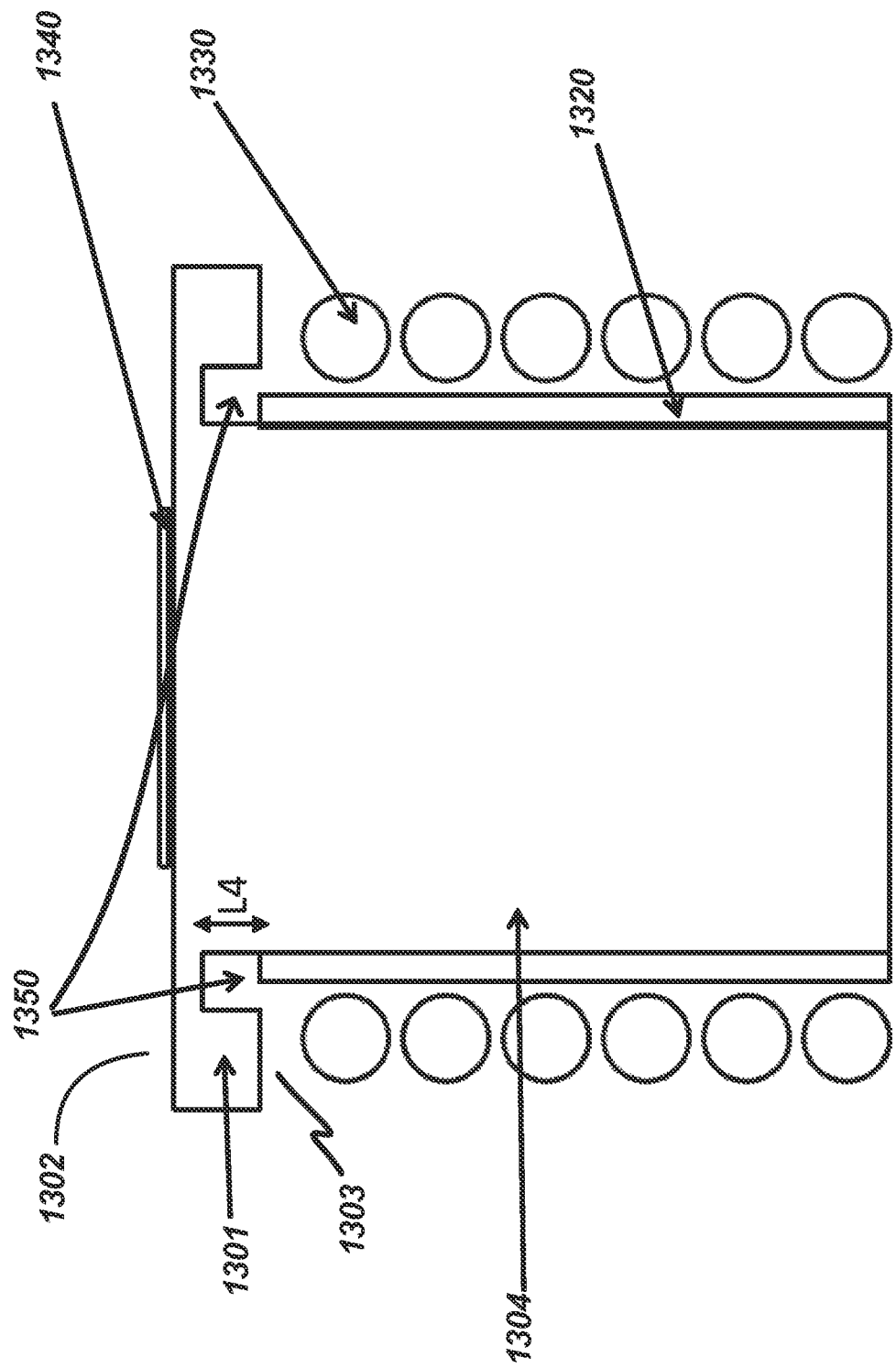
FIG. 13 is a schematic diagram of a mushroom-like susceptor with a groove structure beneath the horizontal plate for blocking heat transfer to the end, according to one or more embodiments of the present disclosure.
Figure 14:
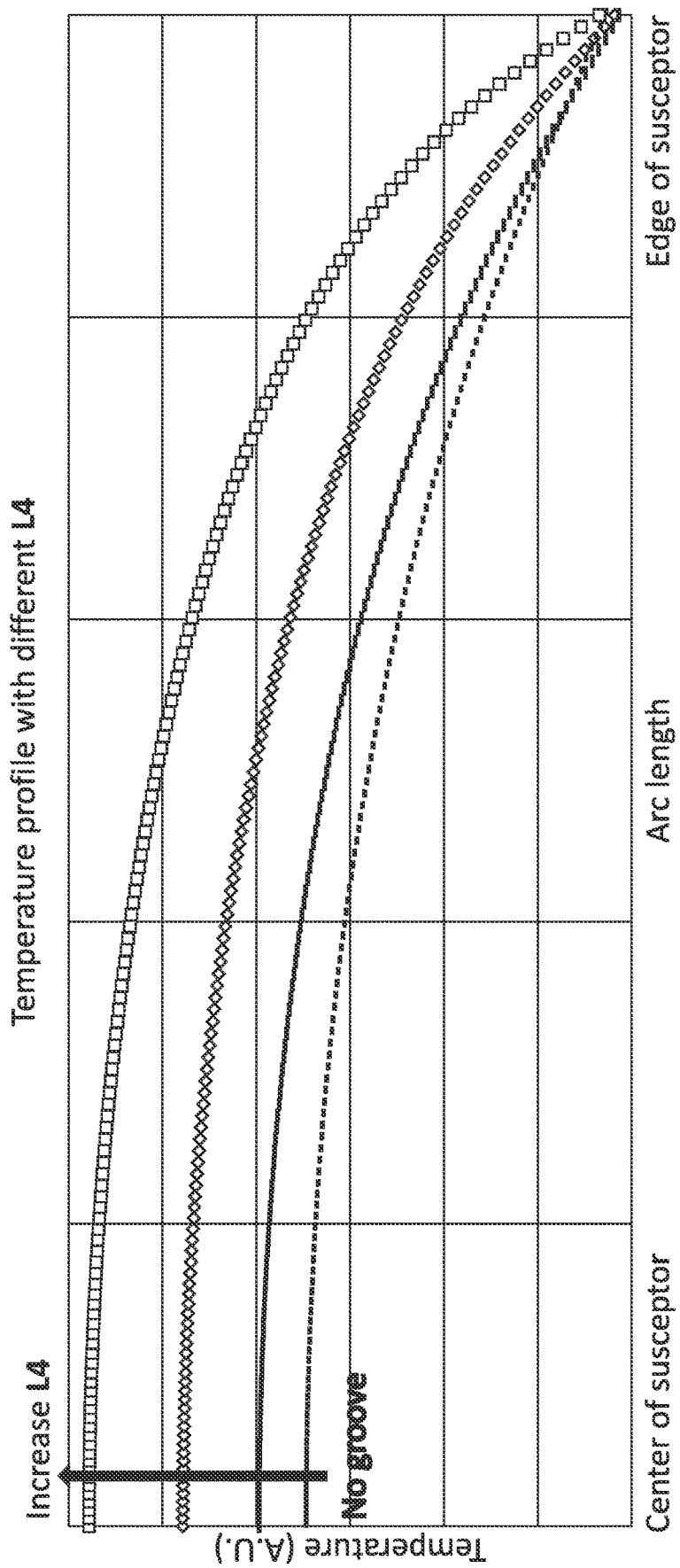
FIG. 14 is a graphical view of a temperature profile showing a rise in surface temperature with an increase in L5 which blocks heat transfer to the edge of the horizontal plate, according to one or more embodiments of the present disclosure.

In some embodiments, a groove structure may be provided to provide greater control over heat transfer. FIG. 13 is a schematic diagram of a mushroom-like susceptor with a groove structure 1350 beneath the horizontal plate 1301 for blocking heat transfer to the end/edge of the horizontal component, according to one or more embodiments of the present disclosure. As shown in FIG. 13, the susceptor may include a horizontal component 1301 (e.g., horizontal plate), wherein the horizontal component 1301 includes a top surface 1302, a bottom surface 1303, and grooves or groove structures 1350. The top surface 1302 may be configured to hold one or more wafers 1340. The vertical component 1304 (e.g., vertical rod) may extend from the bottom surface 1303 of the horizontal component 1301 along a longitudinal axis that is substantially perpendicular to the horizontal component 1301. The hollow region (not shown) may optionally be included in the vertical component 1304. A thermal insulator 1320 and induction coils 1330 may surround the vertical component 1304. In this way, the surface temperature may be controlled for hollowed susceptors with a deep hollow structure (e.g., a large L5). For example, FIG. 14 is a graphical view of a temperature profile showing a rise in surface temperature with an increase in L5 which blocks heat transfer to the edge of the horizontal plate, according to one or more embodiments of the present disclosure.

Figure 15:
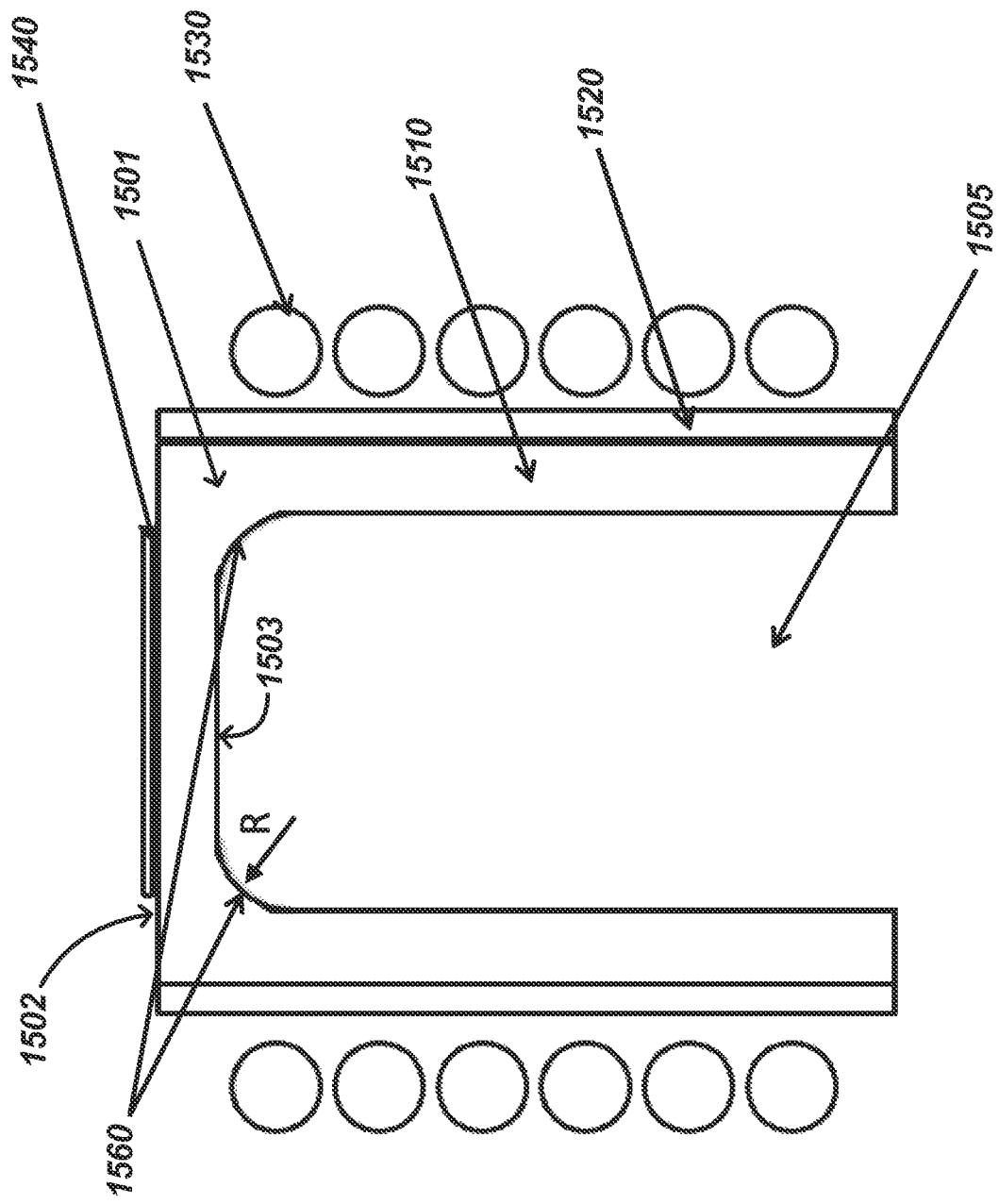
FIG. 15 is a schematic diagram of a hollowed cylinder-shaped susceptor with enhanced thermal uniformity on the top surface with a fillet structure in a corner of the hollow region for enhanced heat transfer, according to one or more embodiments of the present disclosure.

In some embodiments, fillets on the corner of the hollow region may be utilized to improve heat transfer. For example, FIG. 15 is a schematic diagram of a hollowed cylinder-shaped susceptor with enhanced thermal uniformity on the top surface with a fillet structure in a corner of the hollow region for enhanced heat transfer, according to one or more embodiments of the present disclosure. As shown in FIG. 15, the susceptor may include a horizontal component 1501 with a top surface 1502 and a bottom surface 1503, wherein the top surface 1502 is configured to hold one or more wafers 1540. A vertical component 1504 or cylindrical susceptor 1510 may extend from the bottom surface of the horizontal component 1501 along a longitudinal axis that is substantially perpendicular to the horizontal component 1501. A hollow region 1505 (e.g., cylindrical hole) may be within the vertical component 1504. The hollow region may include fillets 1560 with radius R. The fillets 1560 may be used to shape the hollow region nearest to the horizontal component of the susceptor. In this embodiment, a radius of the horizontal component may be about equal to the radius of the vertical component. The susceptor may further comprise a thermal insulator 1520 that surrounds the vertical component 1504 or cylindrical susceptor 1510. The susceptor may further comprise induction coil 1530 that surrounds the thermal insulator 1520.

Figure 16:
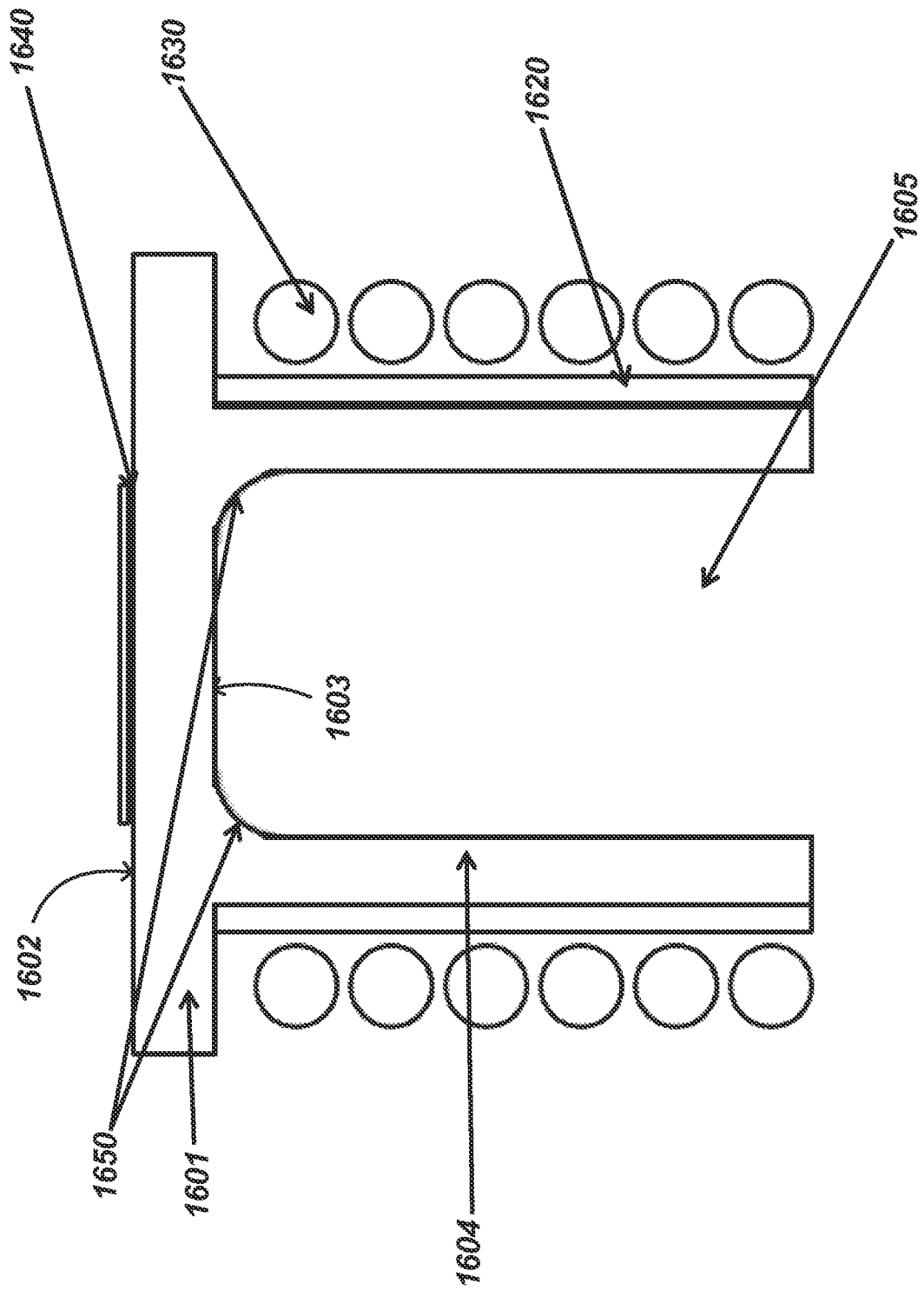
FIG. 16 is a schematic diagram of a hollowed mushroom-shaped susceptor with enhanced thermal uniformity on the top surface with a fillet structure in a corner of the hollow region for enhanced heat transfer, according to one or more embodiments of the present disclosure.
Figure 17:
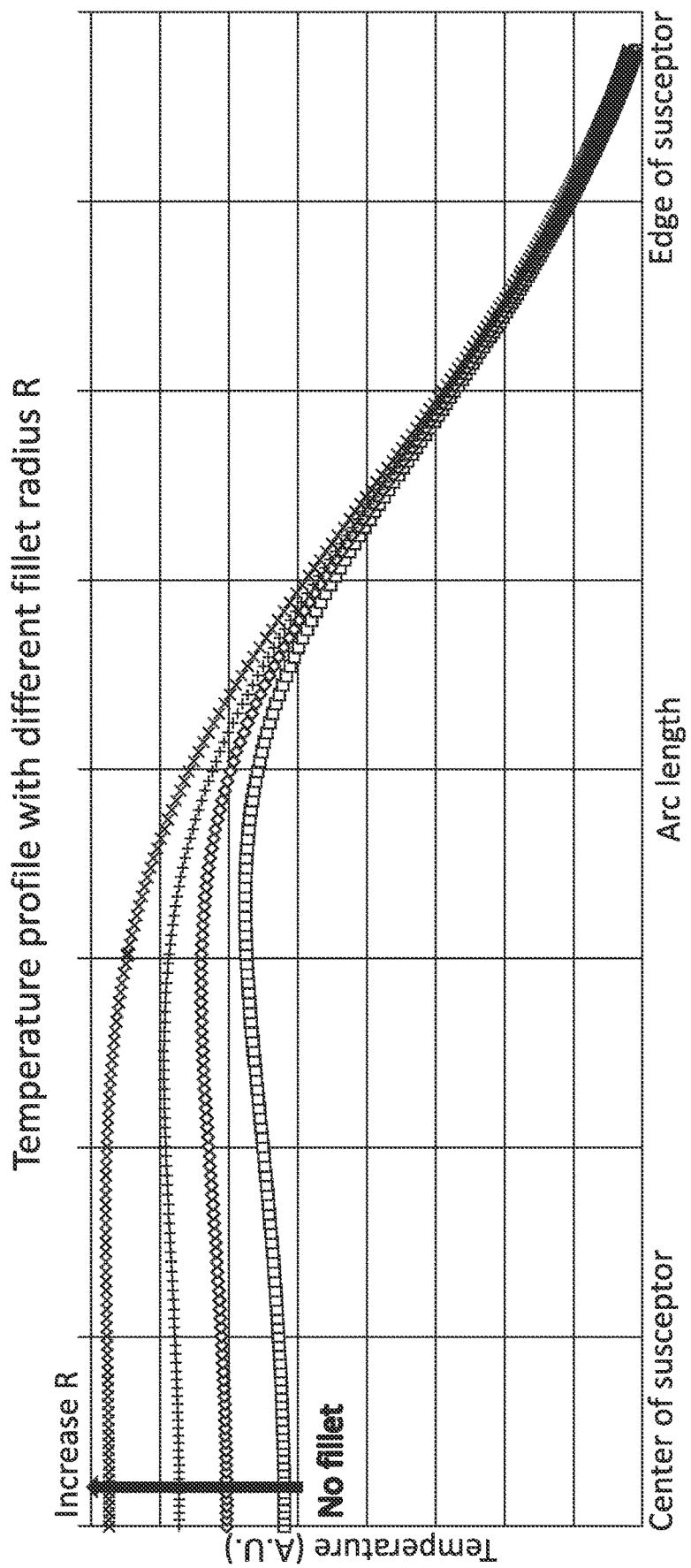
FIG. 17 is a graphical view of a temperature profile showing an improvement in heat transfer with an increase in R, according to one or more embodiments of the present disclosure.

Similarly, FIG. 16 is a schematic diagram of a hollowed mushroom-shaped susceptor with enhanced thermal uniformity on the top surface with a fillet structure in a corner of the hollow region for enhanced heat transfer, according to one or more embodiments of the present disclosure. As shown in FIG. 16, the susceptor may include a horizontal component 1601 (e.g., horizontal plate) with a top surface 1602 and a bottom surface 1603, wherein the top surface 1602 is configured to support one or more wafers 1640. A vertical component (e.g., vertical rod) 1604 may extend from a bottom surface of the horizontal component 1601 along a longitudinal axis that is substantially perpendicular to the horizontal component 1601. A hollow region 1605 (e.g., cylindrical hole) may be within the vertical component 1604. The hollow region 1605 may include fillets 1660. The fillets 1660 may be used to shape the hollow region nearest to the horizontal component of the susceptor. In this embodiment, a radius of the horizontal component is greater than the radius of the vertical component, which gives rise, for example, to a mushroom-shaped susceptor. As in other embodiments, a thermal insulator 1620 and induction coil 1630 may surround the vertical component 1604. Filleted or rounded corners observe greater heat transfer efficiency compared to right-angle corners. By introducing fillet corners, the surface temperature may be controlled for hollowed susceptors with a deep hollow structure (e.g., a large L5). For example, FIG. 17 is a graphical view of a temperature profile showing an improvement in heat transfer with an increase in R, according to one or more embodiments of the present disclosure.

The following Examples are intended to illustrate the above invention and should not be construed as to narrow its scope. One skilled in the art will readily recognize that the Examiners suggest many other ways in which the invention could be practiced. It should be understand that numerous variations and modifications may be made while remaining within the scope of the invention.

Example 1

Optimized Susceptor

The following Example describes a solution to temperature non-uniformity. The solution may include creating a hole, or hollow region, in the vertical component of, for example, a mushroom-type susceptor (e.g., such as one where a radius of the horizontal component is greater than the vertical component). See FIGS. 18A-18D, for example, which are schematic diagrams of a mushroom-type susceptor showing (A)-(C) various cross-sectional views of a mushroom susceptor and (D) an isometric view of a mushroom-type susceptor, according to one or more embodiments of the present disclosure.

Figure 18D:
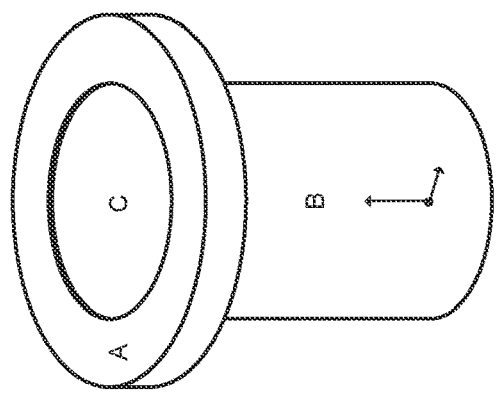
FIGS. 18A-18D are schematic diagrams of a mushroom-type susceptor showing (A)-(C) various cross-sectional views of a mushroom susceptor and (D) an isometric view of a mushroom-type susceptor, according to one or more embodiments of the present disclosure.
Figure 18C:
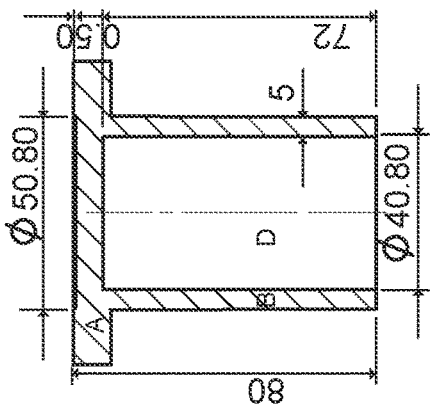
Figure 18B:
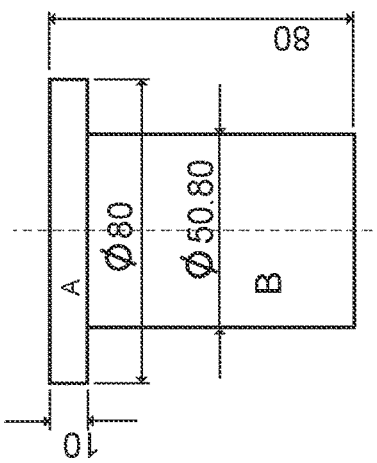
Figure 18A:
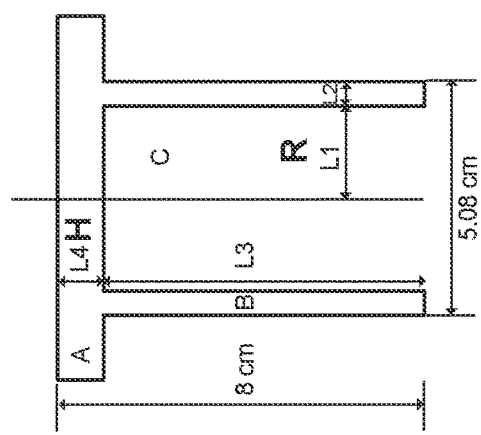

In particular, FIG. 18A is a schematic diagram of a cross-sectional view of a mushroom susceptor including horizontal component A, vertical component B, and hollow region C which is within the vertical component B. The parameters include L1, L2, L3, and L4, wherein L1 is defined as the radius of the vertical component, R; L2 refers to a thickness of the vertical component; L3 refers to the depth of the cylindrical hollow region; L4 refers to a thickness of the horizontal plate, H (e.g., the distance between the top surface and bottom surface). In an embodiment, L1 and L4 are parameters that are important to consider and/or adjust when improving temperature uniformity. FIG. 18B is a side view of a mushroom-type susceptor for a 2 inch wafer. FIG. 18C is an example of a mushroom-type susceptor in which L1 (e.g., R) and L4 (e.g., H) are optimized for a 2 inch wafer. FIG. 18D is an isometric view of a mushroom susceptor wherein A is the horizontal component (e.g., horizontal plate as shown) for blocking magnetic field during the induction heating, B is the vertical component (e.g., vertical rod as shown) for coupling with the induction coil, and C is a pocket for placing the wafer.

Example 2

Evaluation and Performance of Mushroom-Shaped Susceptors

Computer simulations were used to evaluate and compare the performance of susceptors with and without hollow regions. In some instances, the performance of susceptors with the induction coils shifted downward, and susceptors with both the induction coils shifted downward and a hollow region were evaluated and compared. Data from the computer simulations is presented for mushroom-shaped susceptors for 2 inch, 4 inch, 6 inch, and 8 inch substrates. The mushroom-shaped susceptors were heated by induction heater.

Mushroom-Shaped Susceptor for 2" Substrate

Data from the computer simulation of a mushroom-shaped susceptor for a 2 inch substrate heated by induction heater is presented in FIGS. 19-21.

Figures 19A, 19B:
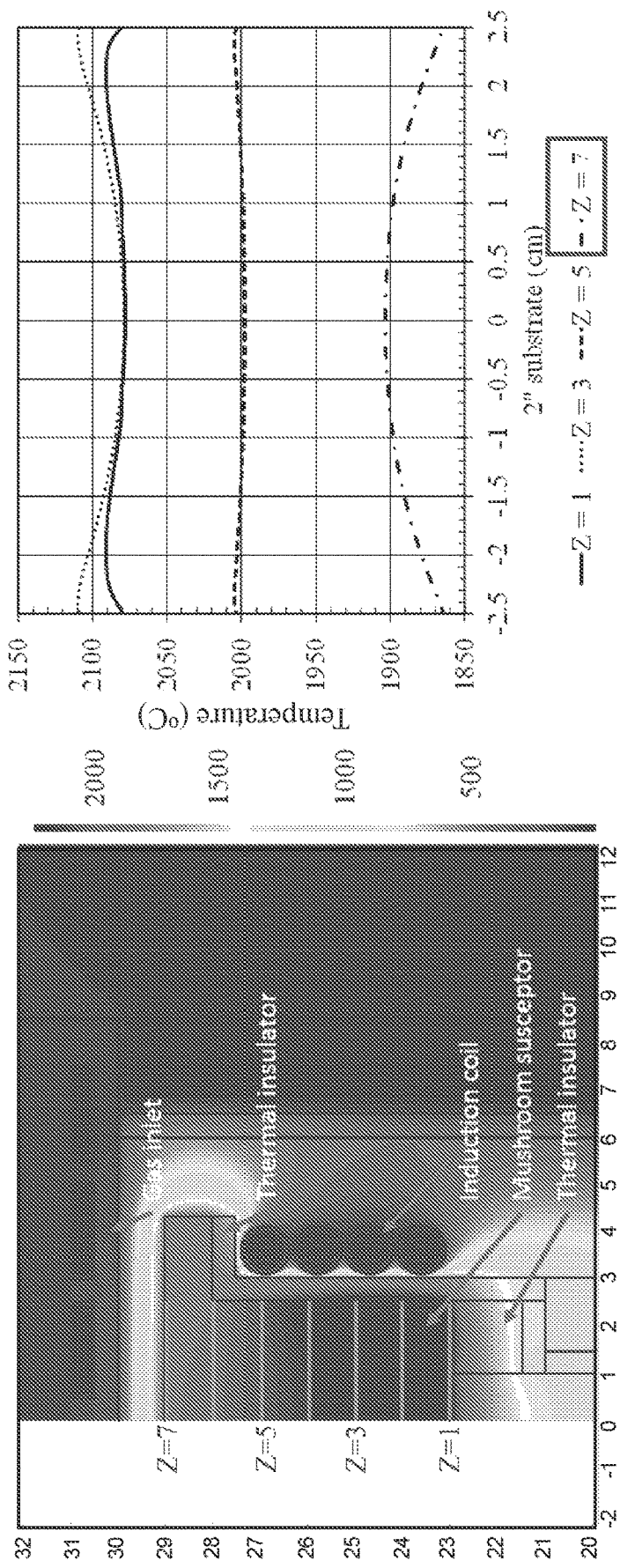
FIGS. 19A-19B show (A) a schematic diagram of a mushroom-type susceptor for a 2 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure.

FIGS. 19 and 20 present data for the mushroom-shaped susceptor without and with a hollow region, respectively, In particular, FIGS. 19A-19B show (A) a schematic diagram of a mushroom-type susceptor for a 2 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure. As shown in FIG. 19B, at Z=7, the temperature non-uniformity can be observed.

Figures 20A, 20B:
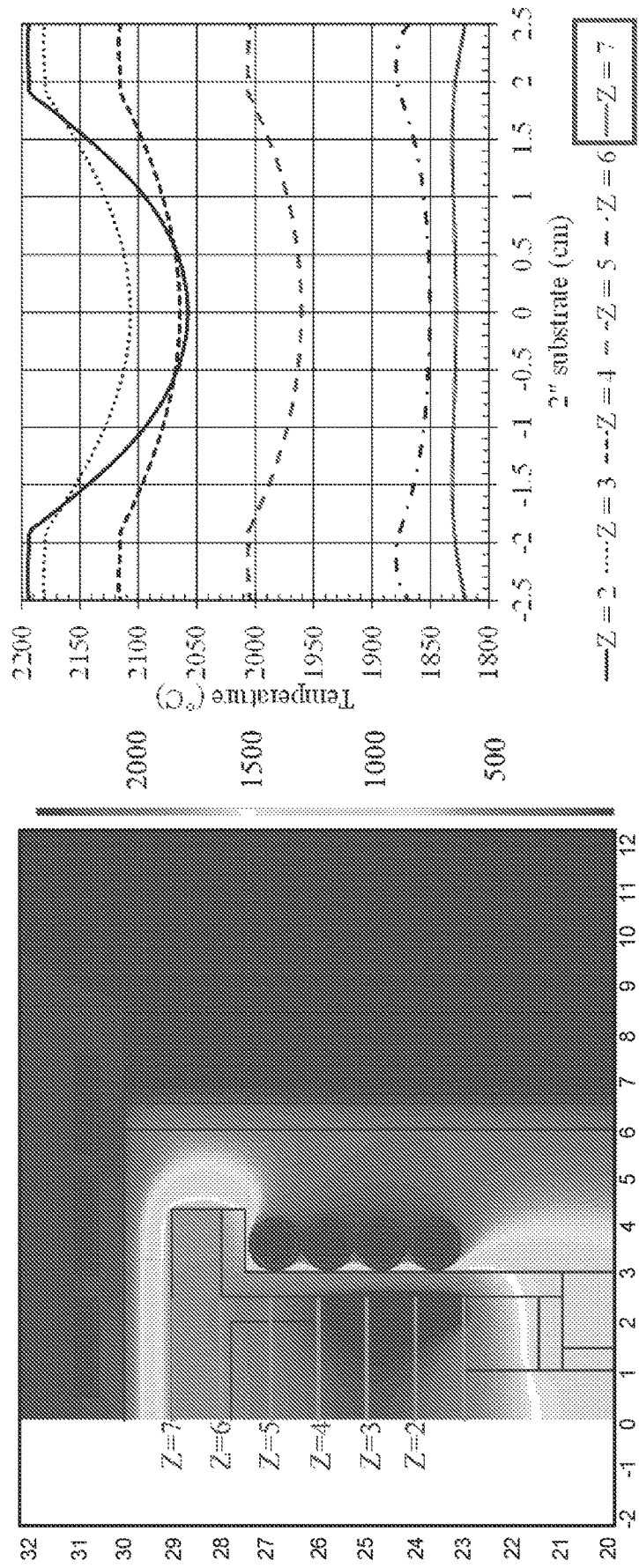
FIGS. 20A-20B show (A) a schematic diagram of a mushroom-type susceptor for a 2 inch substrate with a hollow region, where Z=2 to 7 identify positions that correspond to cross-section temperature profiles shown in (B), and (B) is a graphical view of the cross-section temperature profiles of the susceptor at corresponding positions Z=2 to 7, according to one or more embodiments of the present disclosure.

FIGS. 20A-20B show (A) a schematic diagram of a mushroom-type susceptor for a 2 inch substrate with a hollow region, where Z=2 to 7 identify positions that correspond to cross-section temperature profiles shown in (B), and (B) is a graphical view of the cross-section temperature profiles of the susceptor at corresponding positions Z=2 to 7, according to one or more embodiments of the present disclosure. As shown in FIG. 20B, at Z=7, the temperature non-uniformity is improved.

Figures 21A, 21B:
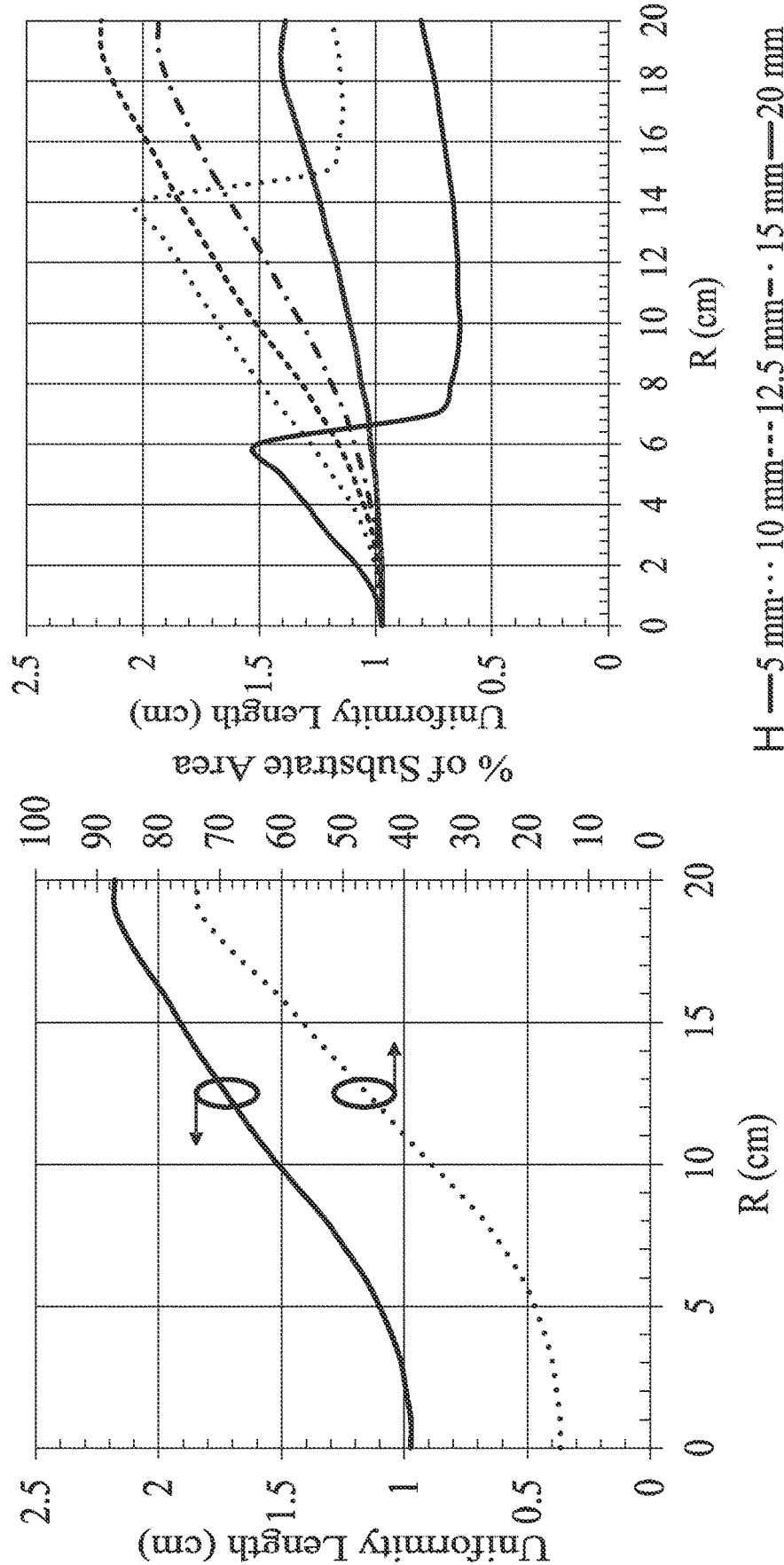
FIGS. 21A-21B show, for a susceptor for a 2 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure.

The performance of the mushroom-shaped susceptor for a 2 inch substrate at different R (radius of hollow region) and H (thickness of horizontal component) was evaluated to optimize temperature uniformity. FIGS. 21A-21B show, for a susceptor for a 2 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure. The best temperature uniformity was observed for the susceptor when R=20 mm and H=12.5 mm.

Figure 22:
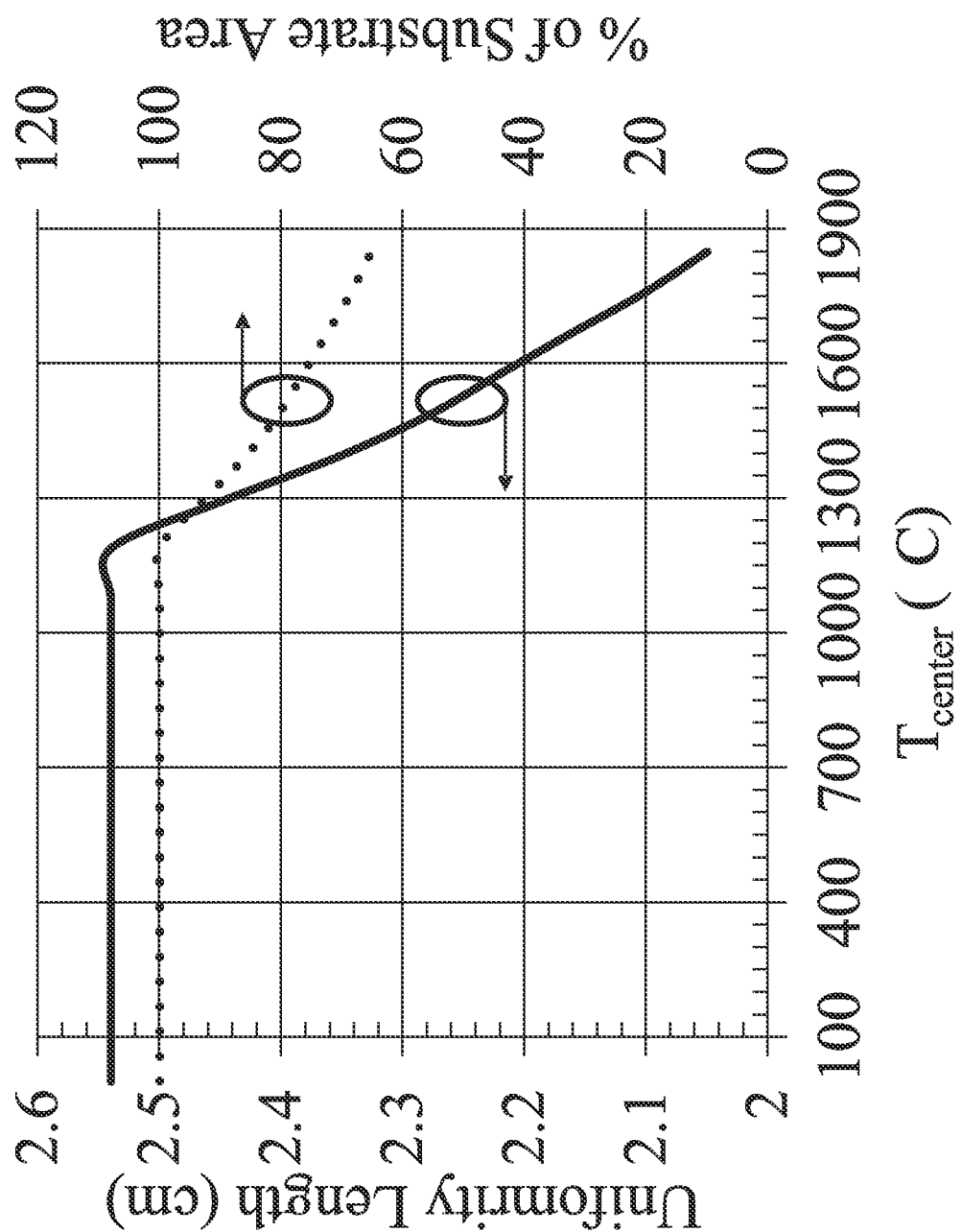
FIG. 22 is a graphical view of uniformity length (left y-axis) and percent of substrate area with temperature non-uniformity less than 5° C. (right y-axis) versus temperature, according to one or more embodiments of the present disclosure.

FIG. 22 is a graphical view of uniformity length (left y-axis) and percent of substrate area with temperature non-uniformity less than 5° C. (right y-axis) versus temperature, according to one or more embodiments of the present disclosure. This figure makes clear that when R and H are optimized at high temperature, the temperature uniformity at low temperature is even better.

Mushroom-Shaped Susceptor for 4" Substrate

Data from the computer simulation of a mushroom-shaped susceptor for a 4 inch substrate heated by induction heater is presented in FIGS. 23-26. In particular, a mushroom-shaped susceptor without a hollow region (FIG. 23), with the induction coils shifted downward (FIG. 24), and with both a hollow region and the induction coils shifted downward (FIG. 25), were evaluated and optimized in FIG. 26.

Figures 23A, 23B:
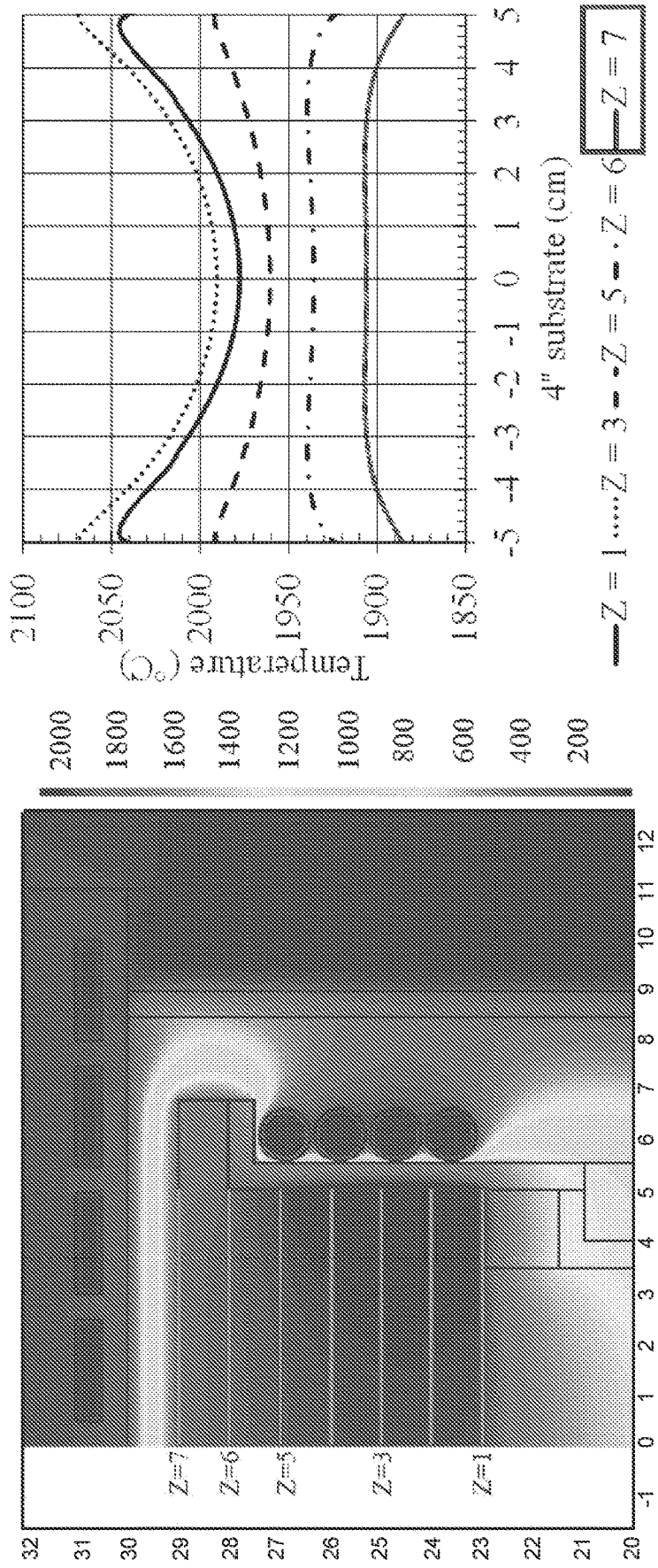
FIGS. 23A-23B show (A) a schematic diagram of a mushroom-type susceptor for a 4 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure.

In particular, FIGS. 23A-23B show (A) a schematic diagram of a mushroom-type susceptor for a 4 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure. As shown in FIG. 23B, at Z=7, the temperature non-uniformity is acceptable.

Figures 24A, 24B:
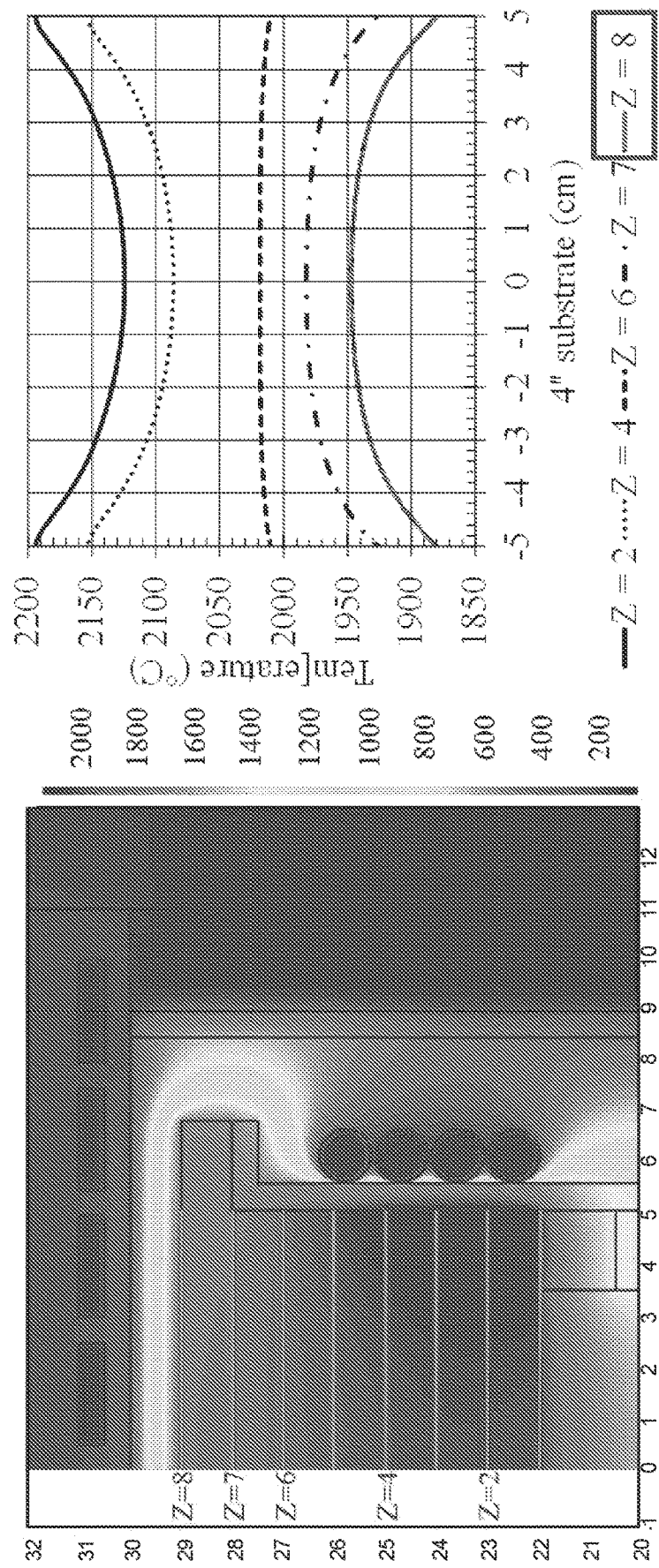
FIGS. 24A-24B show (A) a schematic diagram of a mushroom-type susceptor for a 4 inch substrate with the induction coils shifted downward, where Z=2 to 8 identify positions that correspond to cross-section temperature profiles shown in (B), and (B) is a graphical view of the cross-section temperature profiles of the susceptor at corresponding positions Z=2 to 8, according to one or more embodiments of the present disclosure.

FIGS. 24A-24B show (A) a schematic diagram of a mushroom-type susceptor for a 4 inch substrate with the induction coils shifted downward, where Z=2 to 8 identify positions that correspond to cross-section temperature profiles shown in (B), and (B) is a graphical view of the cross-section temperature profiles of the susceptor at corresponding positions Z=2 to 8, according to one or more embodiments of the present disclosure. As shown in FIG. 24B, at Z=8, the temperature non-uniformity gets worse. While shifting the induction coils downward for a 4 inch substrate may not be advisable, it can benefit temperature non-uniformity for larger substrates, such as 6 inch and/or 8 inch substrates.

Figures 25A, 25B:
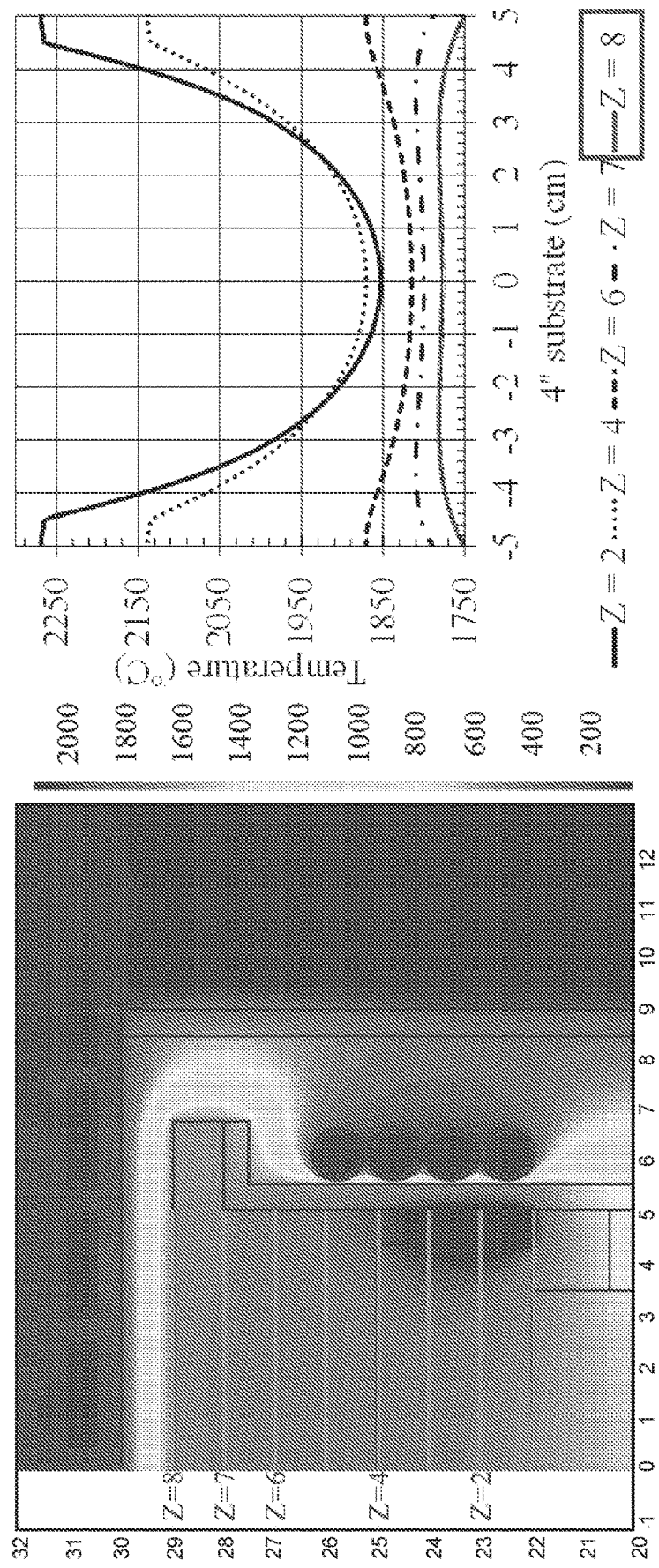
FIGS. 25A-25B show (A) a schematic diagram of a mushroom-type susceptor for a 4 inch substrate with a hollow region and the induction coils shifted downward, where Z=2 to 8 identify positions that correspond to cross-section temperature profiles shown in (B), and (B) is a graphical view of the cross-section temperature profiles of the susceptor at corresponding positions Z=2 to 8, according to one or more embodiments of the present disclosure.

FIGS. 25A-25B show (A) a schematic diagram of a mushroom-type susceptor for a 4 inch substrate with a hollow region and the induction coils shifted downward, where Z=2 to 8 identify positions that correspond to cross-section temperature profiles shown in (B), and (B) is a graphical view of the cross-section temperature profiles of the susceptor at corresponding positions Z=2 to 8, according to one or more embodiments of the present disclosure. As shown in FIG. 25B, shifting the induction coils downward and including a hollow region can benefit and/or improve temperature uniformity.

Figures 26A, 26B:
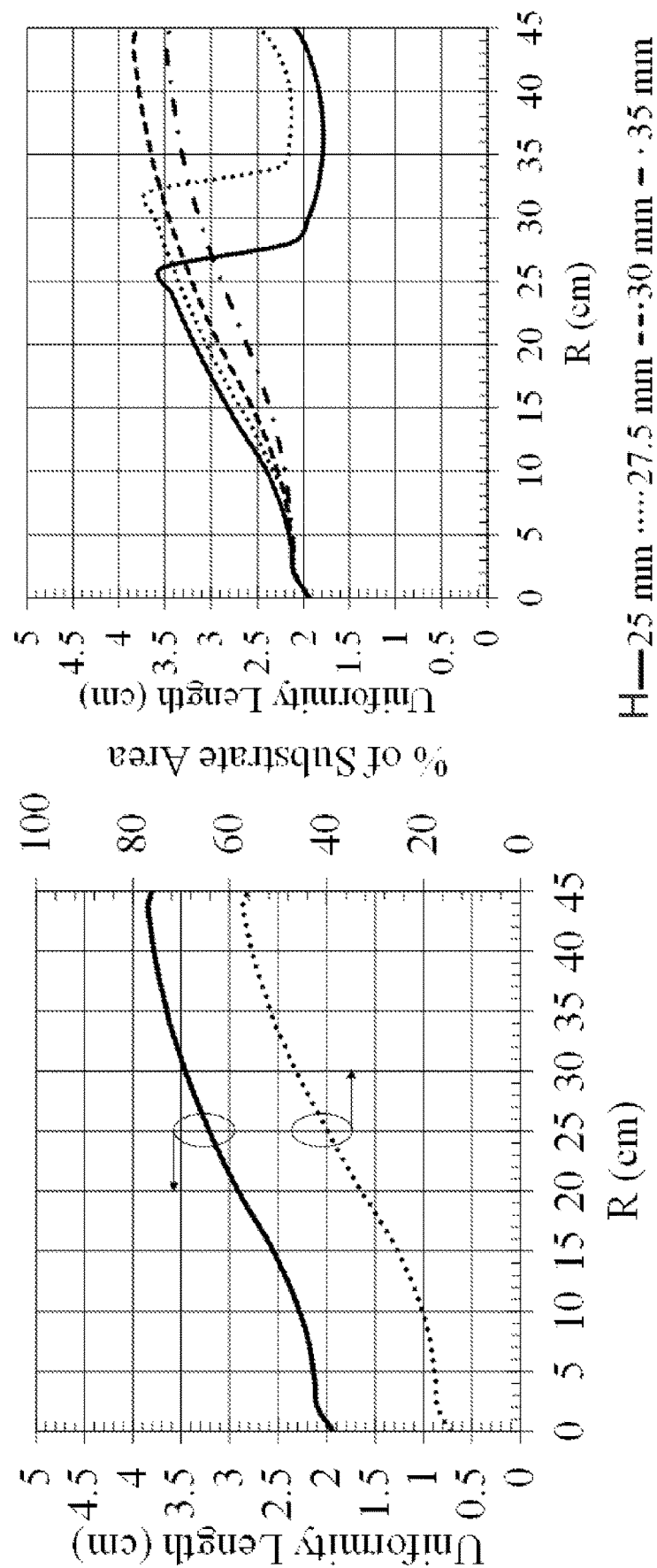
FIGS. 26A-26B show, for a susceptor for a 4 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various H (thicknesses of the horizontal component), according to one or more embodiments of the present disclosure.

The performance of the mushroom-shaped susceptor for a 4 inch substrate at different R (radius of hollow region) and H (thickness of horizontal component) was evaluated to optimize temperature uniformity. FIGS. 26A-26B show, for a susceptor for a 4 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various H (thicknesses of the horizontal component), according to one or more embodiments of the present disclosure. The best temperature uniformity was observed for the susceptor when R=44 mm and H=30 mm and the induction coil was shifted 10 mm downward.

Mushroom-Shaped Susceptor for 6" Substrate

Data from the computer simulation of a mushroom-shaped susceptor for a 4 inch substrate heated by induction heater is presented in FIGS. 27-30. In particular, a mushroom-shaped susceptor without a hollow region (FIG. 27), with the induction coils shifted downward (FIG. 28), and with both a hollow region and the induction coils shifted downward (FIG. 29), were evaluated and optimized in FIG. 30.

Figures 27A, 27B:
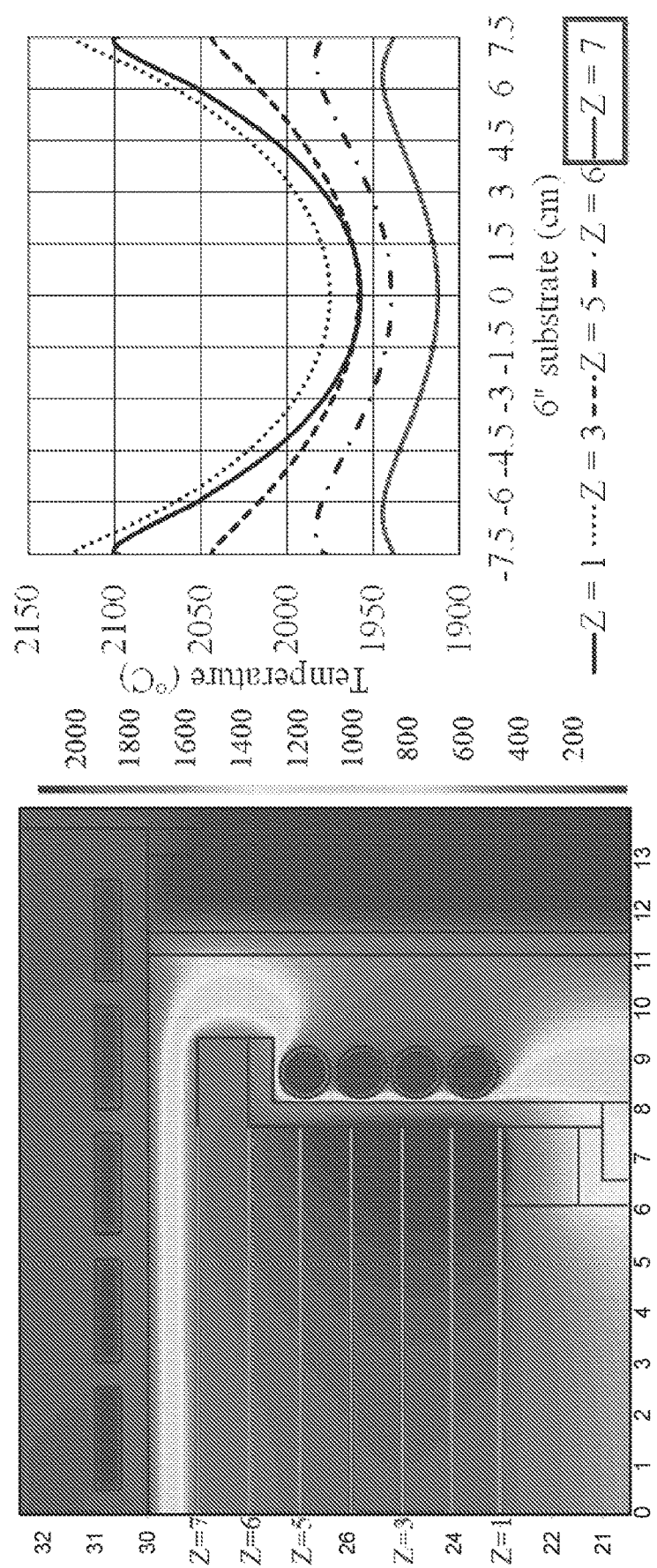
FIGS. 27A-27B show (A) a schematic diagram of a mushroom-type susceptor for a 6 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure.

In particular, FIGS. 27A-27B show (A) a schematic diagram of a mushroom-type susceptor for a 6 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure. As shown in FIG. 27B, at Z=7, the temperature non-uniformity can be observed.

Figures 28A, 28B:
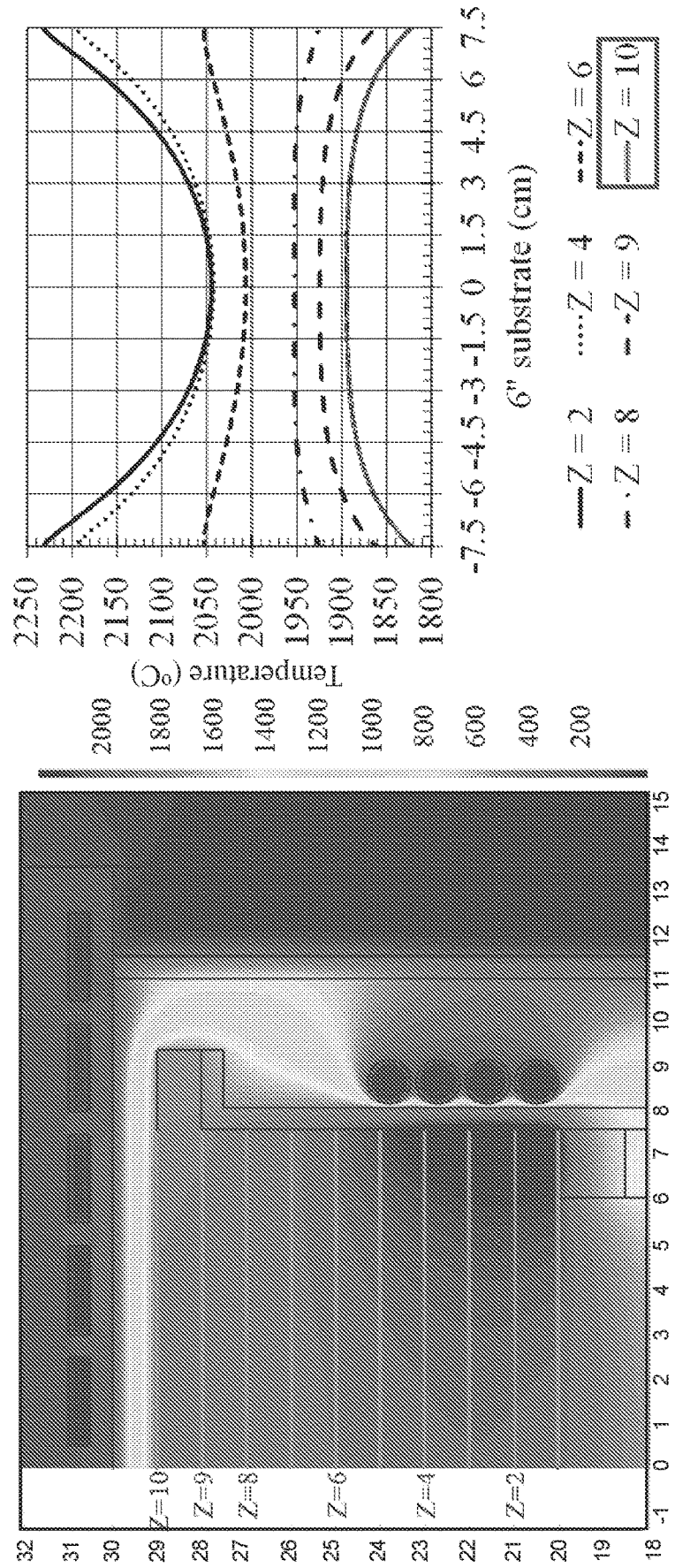
FIGS. 28A-28B show (A) a schematic diagram of a mushroom-type susceptor for a 6 inch substrate with the induction coils shifted downward, where Z=2 to 10 identify positions that correspond to cross-section temperature profiles shown in (B), and (B) is a graphical view of the cross-section temperature profiles of the susceptor at corresponding positions Z=2 to 10, according to one or more embodiments of the present disclosure.

FIGS. 28A-28B show (A) a schematic diagram of a mushroom-type susceptor for a 6 inch substrate with the induction coils shifted downward, where Z=2 to 10 identify positions that correspond to cross-section temperature profiles shown in (B), and (B) is a graphical view of the cross-section temperature profiles of the susceptor at corresponding positions Z=2 to 10, according to one or more embodiments of the present disclosure. As shown in FIG. 28B, at Z=10, the temperature non-uniformity is improved. Shifting the induction coil downward can benefit the temperature uniformity, and the improvement can be better once a hollow region is created in the vertical component.

Figures 29A, 29B:
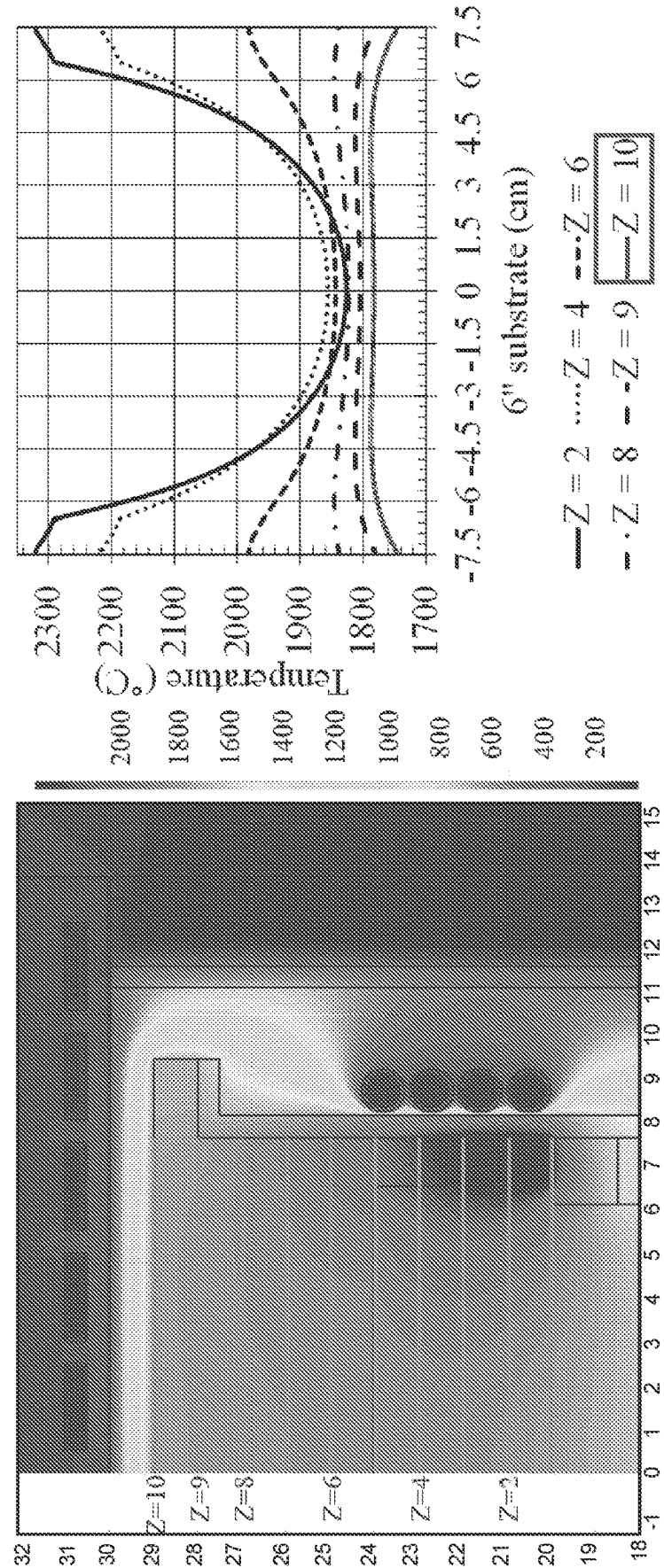
FIGS. 29A-29B show (A) a schematic diagram of a mushroom-type susceptor for a 6 inch substrate with a hollow region and the induction coils shifted downward, where Z=2 to 10 identify positions that correspond to cross-section temperature profiles shown in (B), and (B) is a graphical view of the cross-section temperature profiles of the susceptor at corresponding positions Z=2 to 10, according to one or more embodiments of the present disclosure.

FIGS. 29A-29B show (A) a schematic diagram of a mushroom-type susceptor for a 6 inch substrate with a hollow region and the induction coils shifted downward, where Z=2 to 10 identify positions that correspond to cross-section temperature profiles shown in (B), and (B) is a graphical view of the cross-section temperature profiles of the susceptor at corresponding positions Z=2 to 10, according to one or more embodiments of the present disclosure. As shown in FIG. 29, at Z=10, the temperature non-uniformity is improved. Shifting induction coil downward and creating a hollow region in the vertical component can benefit the temperature uniformity.

The performance of the mushroom-shaped susceptor for a 6 inch substrate at different R (radius of hollow region) and H (thickness of horizontal component) was evaluated to optimize temperature uniformity. FIGS. 30A-30B show, for a susceptor for a 6 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure. The best temperature uniformity was observed for the susceptor when R=65 mm and H=50 mm and the induction coil was shifted 40 mm downward.

Mushroom-Shaped Susceptor for 8" Substrate

Data from the computer simulation of a mushroom-shaped susceptor for an 8 inch substrate heated by induction heater is presented in FIGS. 31-34. In particular, a mushroom-shaped susceptor without a hollow region (FIG. 31), with the induction coils shifted downward (FIG. 32), and with both a hollow region and the induction coils shifted downward (FIG. 33), were evaluated and optimized in FIG. 34.

Figures 31A, 31B:
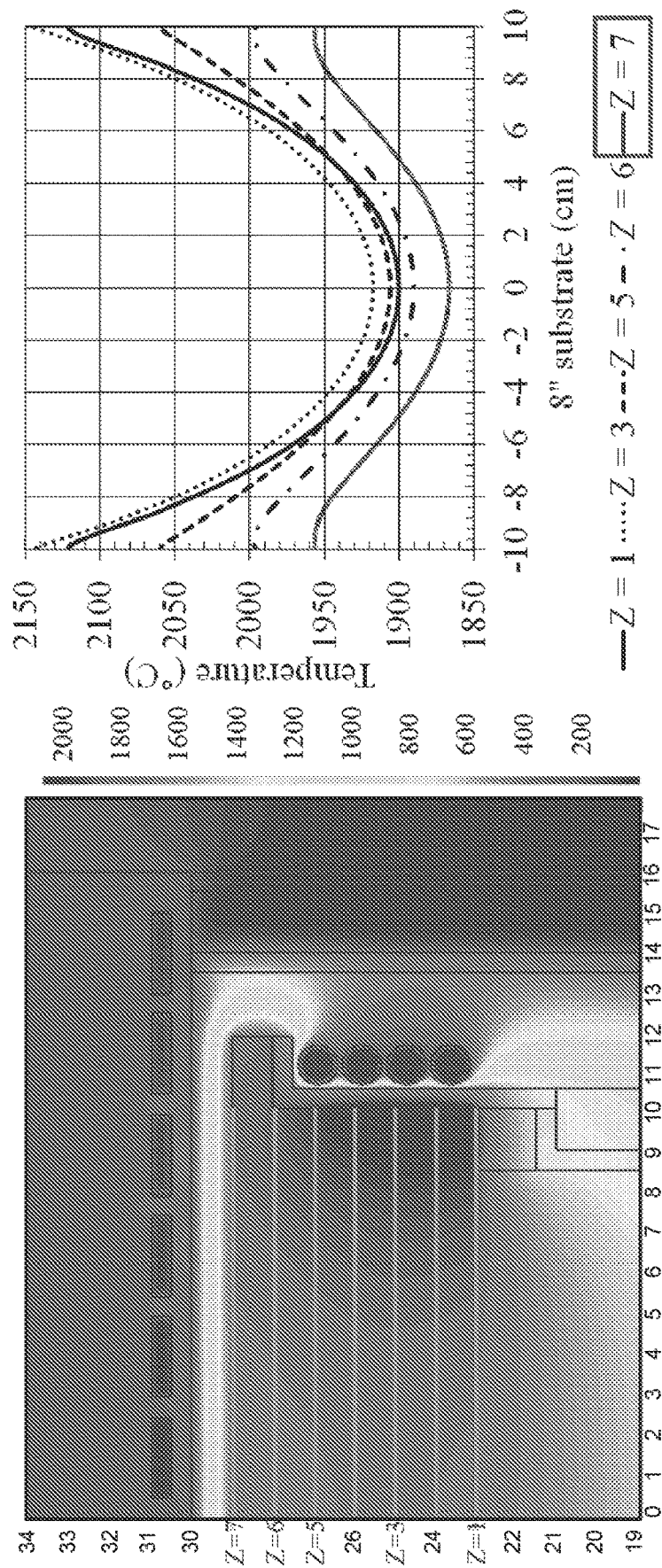
FIGS. 31A-31B show (A) a schematic diagram of a mushroom-type susceptor for a 8 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure.

In particular, FIGS. 31A-31B show (A) a schematic diagram of a mushroom-type susceptor for a 8 inch substrate without a hollow region, where Z=1 to 7 identify positions that correspond to cross-section temperature profiles shown in (B), and (B) is a graphical view of the cross-section temperature profiles of the susceptor at corresponding positions Z=1 to 7, according to one or more embodiments of the present disclosure. As shown in FIG. 31B, at Z=7, the temperature non-uniformity can be observed.

Figures 32A, 32B:
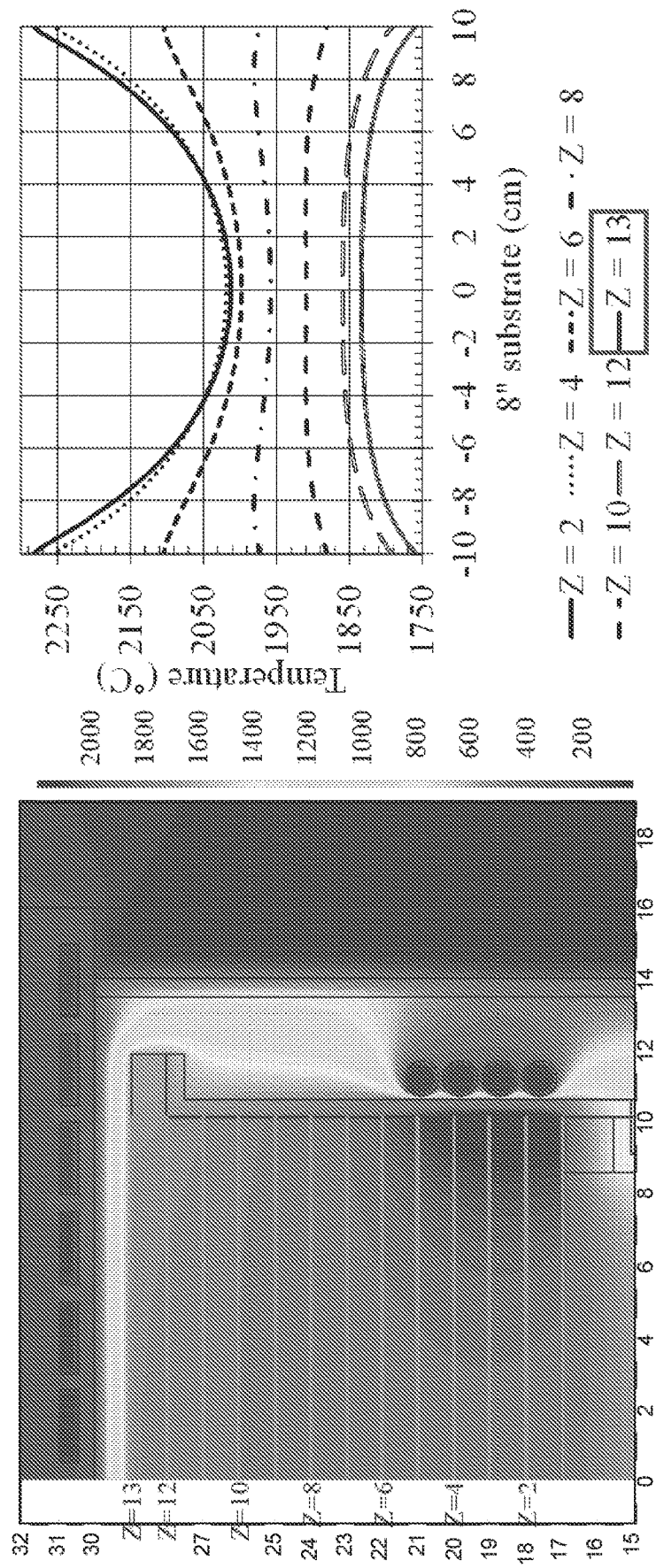
FIGS. 32A-32B show (A) a schematic diagram of a mushroom-type susceptor for a 8 inch substrate with the induction coils shifted downward, where Z=2 to 13 identify positions that correspond to cross-section temperature profiles shown in (B), and (B) is a graphical view of the cross-section temperature profiles of the susceptor at corresponding positions Z=2 to 13, according to one or more embodiments of the present disclosure.

FIGS. 32A-32B show (A) a schematic diagram of a mushroom-type susceptor for a 8 inch substrate with the induction coils shifted downward, where Z=2 to 13 identify positions that correspond to cross-section temperature profiles shown in (B), and (B) is a graphical view of the cross-section temperature profiles of the susceptor at corresponding positions Z=2 to 13, according to one or more embodiments of the present disclosure. As shown in FIG. 32B, at Z=13, the temperature non-uniformity is improved. Shifting induction coil downward can benefit the temperature uniformity, and the improvement can be better once a hollow region is created in the vertical component.

Figures 33A, 33B:
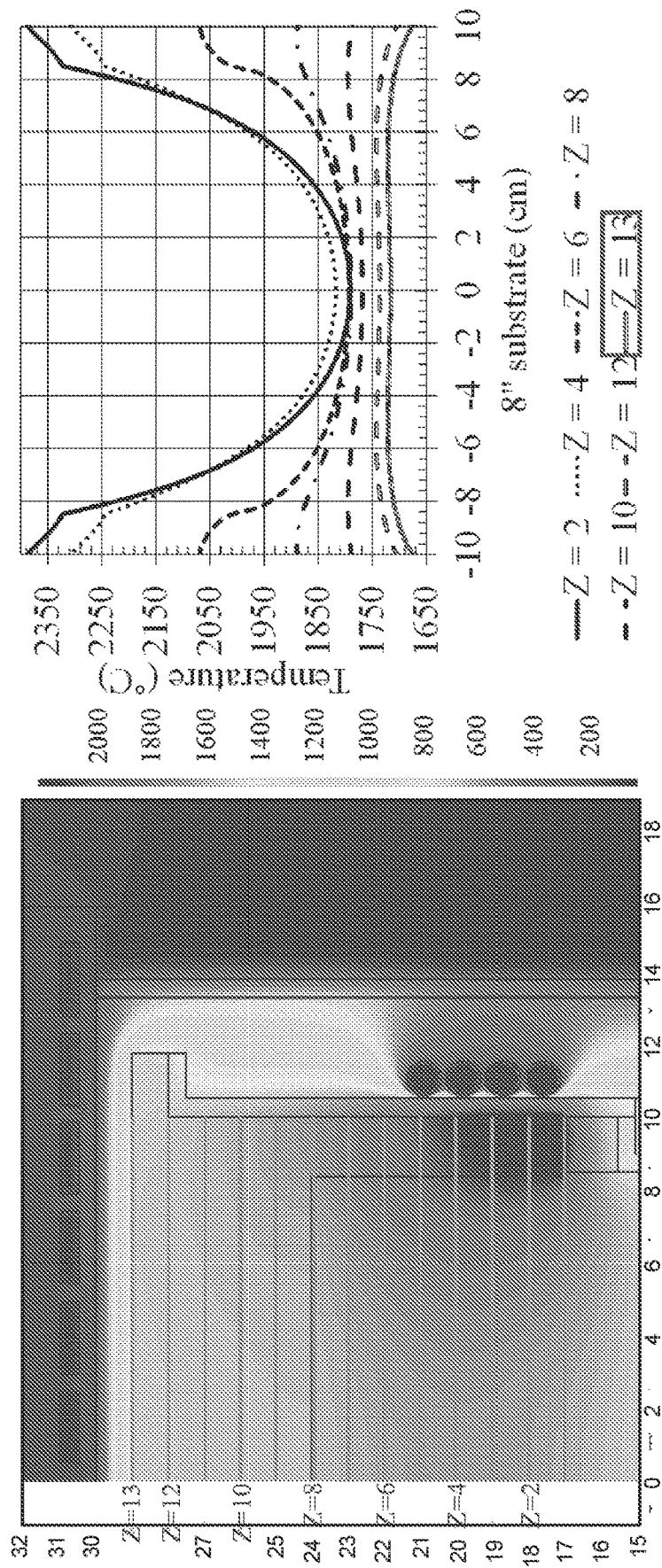
FIGS. 33A-33B show (A) a schematic diagram of a mushroom-type susceptor for a 8 inch substrate with a hollow region and the induction coils shifted downward, where Z=2 to 13 identify positions that correspond to cross-section temperature profiles shown in (B), and (B) is a graphical view of the cross-section temperature profiles of the susceptor at corresponding positions Z=2 to 13, according to one or more embodiments of the present disclosure.

FIGS. 33A-33B show (A) a schematic diagram of a mushroom-type susceptor for a 8 inch substrate with a hollow region and the induction coils shifted downward, where Z=2 to 13 identify positions that correspond to cross-section temperature profiles shown in (B), and (B) is a graphical view of the cross-section temperature profiles of the susceptor at corresponding positions Z=2 to 13, according to one or more embodiments of the present disclosure. As shown in FIG. 33B, at Z=13, the temperature non-uniformity was improved. Shifting the induction coil downward and creating the hollow region in the vertical component can benefit the temperature uniformity.

Figures 34A, 34B:
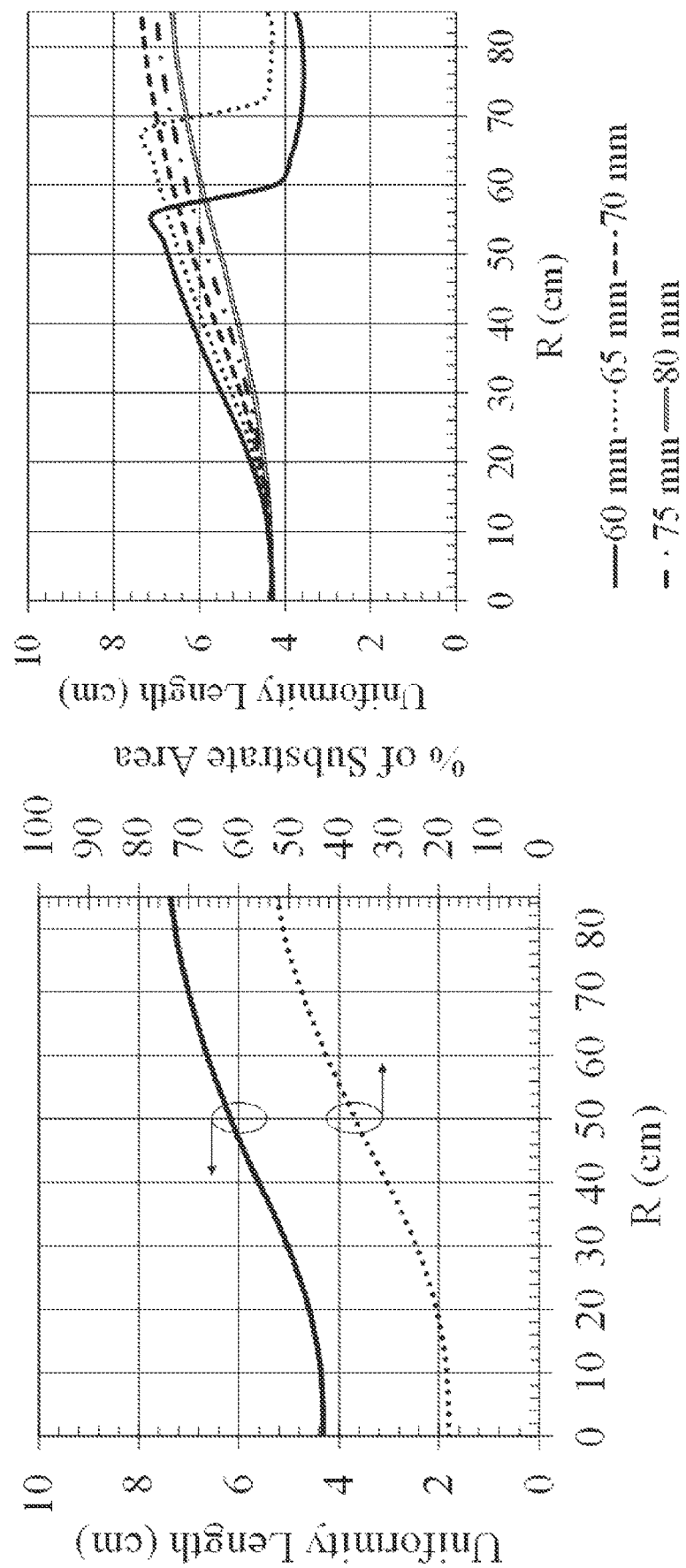
FIGS. 34A-34B show, for a susceptor for a 8 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure.

The performance of the mushroom-shaped susceptor for an 8 inch substrate at different R (radius of hollow region) and H (thickness of horizontal component) was evaluated to optimize temperature uniformity. FIGS. 34A-34B show, for a susceptor for a 8 inch substrate, (A) a graphical view of uniformity length (left y-axis) and percent of substrate area with temperature non-uniformity less than 5° C. (right y-axis) versus R (radius of hollow region); and (B) a graphical view of uniformity length versus R (radius of hollow region) for various thicknesses of the horizontal component, according to one or more embodiments of the present disclosure. The best temperature uniformity was observed for the susceptor when R=82 mm and H=70 mm and the induction coil was shifted 60 mm downward.

Other embodiments of the present disclosure are possible. Although the description above contains much specificity, these should not be construed as limiting the scope of the disclosure, but as merely providing illustrations of some of the presently preferred embodiments of this disclosure. One skilled in the art will readily recognize that the Examiners suggest many other ways in which the invention could be practiced. It should be understand that numerous variations and modifications may be made while remaining within the scope of the invention. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto Various examples have been described. These and other examples are within the scope of the following claims.

What is claimed is:

1. A susceptor for chemical vapor deposition, comprising:
   a horizontal component of susceptor material with a top surface and a bottom surface, the top surface configured to support one or more wafers;
   a vertical component of susceptor material extending from the bottom surface of the horizontal component along a longitudinal axis that is substantially perpendicular to the horizontal component;
   an induction coil surrounding the vertical component; and
   a hollow region within the vertical component, wherein the hollow region includes rounded fillets on the corners, and wherein the rounded fillets are adjacent to the bottom surface.

2. The susceptor of claim 1, wherein the top surface of the horizontal component plate has a substantially uniform temperature distribution in a radial direction.

3. The susceptor of claim 1, wherein a temperature difference across the top surface of the horizontal component in the radial direction is less than or equal to about 3 percent.

4. The susceptor of claim 1, where a temperature difference across the top surface of the horizontal component in the radial direction is less than about 5° C.

5. The susceptor of claim 1, wherein the horizontal component is a cylindrical symmetrical disk shape and the vertical component is a cylindrical symmetrical disk shape.

6. The susceptor of claim 5, wherein the radius of the horizontal component is greater than the radius of the vertical component.

7. The susceptor of claim 5, wherein the radius of the horizontal component is about equal to the radius of the vertical component.

8. The susceptor of claim 1, wherein the horizontal component and the vertical component are made of the same material.

9. The susceptor of claim 1, wherein the horizontal component and the vertical component are made of different materials.

10. The susceptor of claim 1, wherein the horizontal component and the vertical component form a single continuous structure.

11. The susceptor of claim 1, wherein the hollow region reduces heat transfer to the center of the top surface of the horizontal plate.

12. The susceptor of claim 1, wherein the hollow region is a cylindrical shape.

13. The susceptor of claim 1, wherein the horizontal component includes a groove structure for blocking heat transfer to an edge of the horizontal component.

14. The susceptor of claim 1, wherein a thickness of a wall of the vertical component is about greater than a skin depth.

15. The susceptor of claim 1, wherein the induction coil generates heat.

16. The susceptor of claim 15, wherein an about 10 mm gap separates the induction coil from the bottom surface of the horizontal component.

17. The susceptor of claim 1, further comprising a thermal insulator.

18. A susceptor for chemical vapor deposition, comprising:
   a horizontal component of susceptor material with a top surface and a bottom surface, the top surface configured to support one or more wafers, wherein the horizontal component includes a groove structure for blocking heat transfer to an edge of the horizontal component;
   a vertical component of susceptor material extending from the bottom surface of the horizontal component along a longitudinal axis that is substantially perpendicular to the horizontal component;
   an induction coil surrounding the vertical component; and
   a cylindrical hollow region within the vertical component, wherein the hollow region includes rounded fillets on the corners, and wherein the rounded fillets are adjacent to the bottom surface.

* * * * *